(12) United States Patent
Lin et al.

(10) Patent No.: US 11,950,413 B2
(45) Date of Patent: Apr. 2, 2024

(54) HIGH VOLTAGE POLYSILICON GATE IN HIGH-K METAL GATE DEVICE

(71) Applicant: Taiwan Semiconductor Manufacturing Company, Ltd., Hsin-Chu (TW)

(72) Inventors: Meng-Han Lin, Hsinchu (TW); Te-Hsin Chiu, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/079,971

(22) Filed: Dec. 13, 2022

(65) Prior Publication Data
US 2023/0109700 A1 Apr. 13, 2023

Related U.S. Application Data

(63) Continuation of application No. 16/535,431, filed on Aug. 8, 2019, now Pat. No. 11,569,251.

(51) Int. Cl.
*H01L 29/66* (2006.01)
*H01L 21/265* (2006.01)
(Continued)

(52) U.S. Cl.
CPC ....... *H10B 41/40* (2023.02); *H01L 21/26513* (2013.01); *H01L 21/28052* (2013.01); *H01L 21/3212* (2013.01); *H01L 21/32139* (2013.01); *H01L 27/0207* (2013.01); *H01L 29/0847* (2013.01); *H01L 29/40114* (2019.08); *H01L 29/42328* (2013.01); *H01L 29/42364* (2013.01);
(Continued)

(58) Field of Classification Search
CPC ......... H01L 21/26513; H01L 21/28052; H01L 21/3212; H01L 21/32139; H01L 27/0207; H01L 29/0847; H01L 29/40114; H01L 29/42328; H01L 29/42364; H01L 29/42376; H01L 29/4933; H01L 29/665; H01L 29/66545; H01L 29/6656; H01L 29/66575; H10B 10/18; H10B 12/09; H10B 12/50; H10B 41/30; H10B 41/40
See application file for complete search history.

(56) References Cited

U.S. PATENT DOCUMENTS 9,653,460 B1 * 5/2017 Li ..................... H01L 27/0207
10,128,259 B1 11/2018 Yang et al.
(Continued)

OTHER PUBLICATIONS

Non-Final Office Action dated Dec. 15, 2021 for U.S. Appl. No. 16/535,431.
(Continued)

*Primary Examiner* — David C Spalla
(74) *Attorney, Agent, or Firm* — Eschweiler & Potashnik, LLC

(57) ABSTRACT

An integrated circuit device includes a plurality of metal gates each having a metal electrode and a high-κ dielectric and a plurality of polysilicon gates each having a polysilicon electrode and conventional (non high-κ) dielectrics. The polysilicon gates may have adaptations for operation as high voltage gates including thick dielectric layers and area greater than one μm². Polysilicon gates with these adaptations may be operative with gate voltages of 10 V or higher and may be used in embedded memory devices.

20 Claims, 21 Drawing Sheets

(51) Int. Cl.
  *H01L 21/28*    (2006.01)
  *H01L 21/321*   (2006.01)
  *H01L 21/3213*  (2006.01)
  *H01L 27/02*    (2006.01)
  *H01L 29/08*    (2006.01)
  *H01L 29/423*   (2006.01)
  *H01L 29/49*    (2006.01)
  *H10B 41/40*    (2023.01)

(52) U.S. Cl.
  CPC .... *H01L 29/42376* (2013.01); *H01L 29/4933* (2013.01); *H01L 29/665* (2013.01); *H01L 29/66545* (2013.01); *H01L 29/6656* (2013.01); *H01L 29/66575* (2013.01)

(56) References Cited

U.S. PATENT DOCUMENTS

| | | |
|---|---|---|
| 10,325,919 B1 | 6/2019 | Teng et al. |
| 10,872,898 B2 | 12/2020 | Chen et al. |
| 2015/0372137 A1 | 12/2015 | Sakogawa |
| 2019/0027484 A1* | 1/2019 | Chen .................... H10B 43/35 |
| 2019/0035799 A1 | 1/2019 | Shu et al. |
| 2019/0067302 A1 | 2/2019 | Wu et al. |
| 2019/0157285 A1 | 5/2019 | Liu et al. |
| 2019/0165115 A1 | 5/2019 | Lin et al. |

OTHER PUBLICATIONS

Final Office Action dated Jun. 13, 2022 for U.S. Appl. No. 16/535,431.
Notice of Allowance dated Sep. 2, 2022 for U.S. Appl. No. 16/535,431.

* cited by examiner

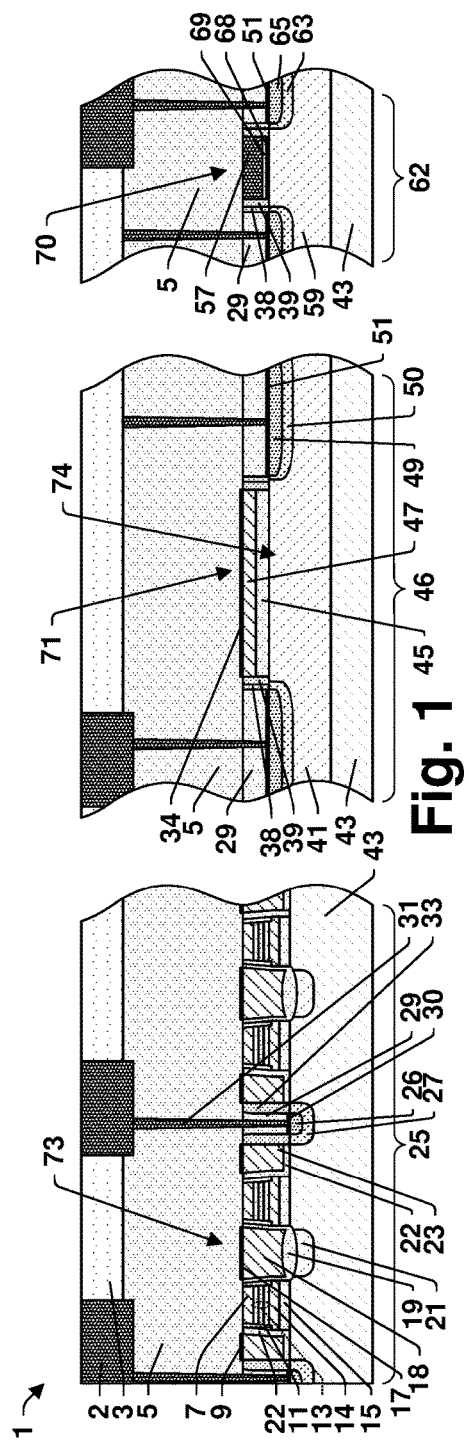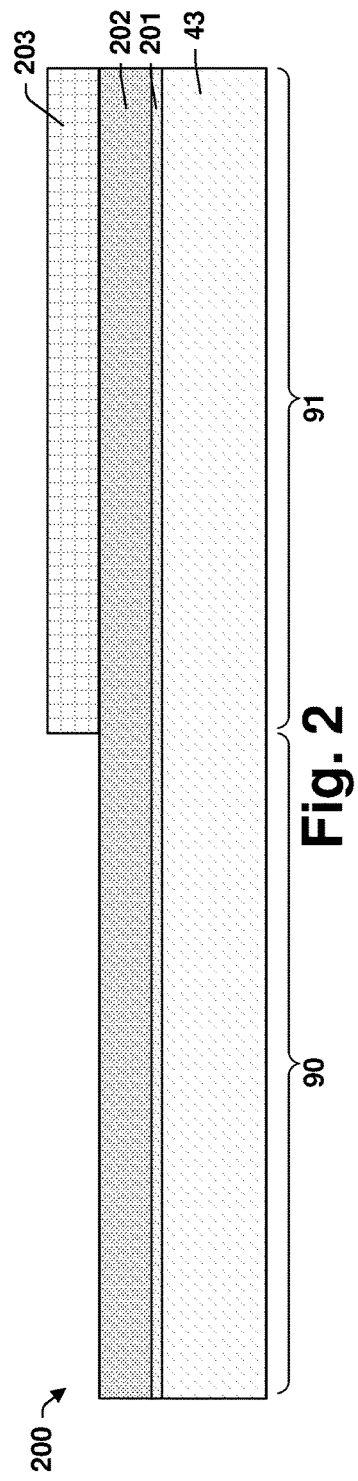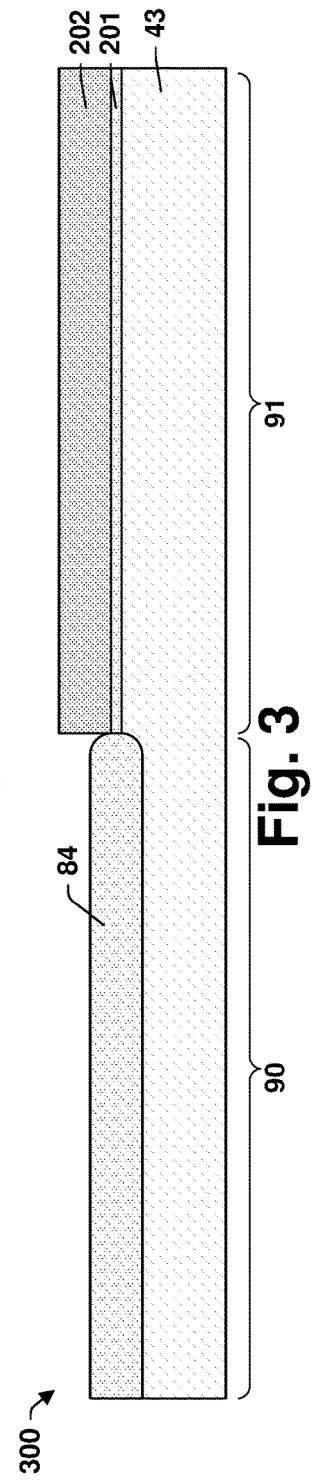

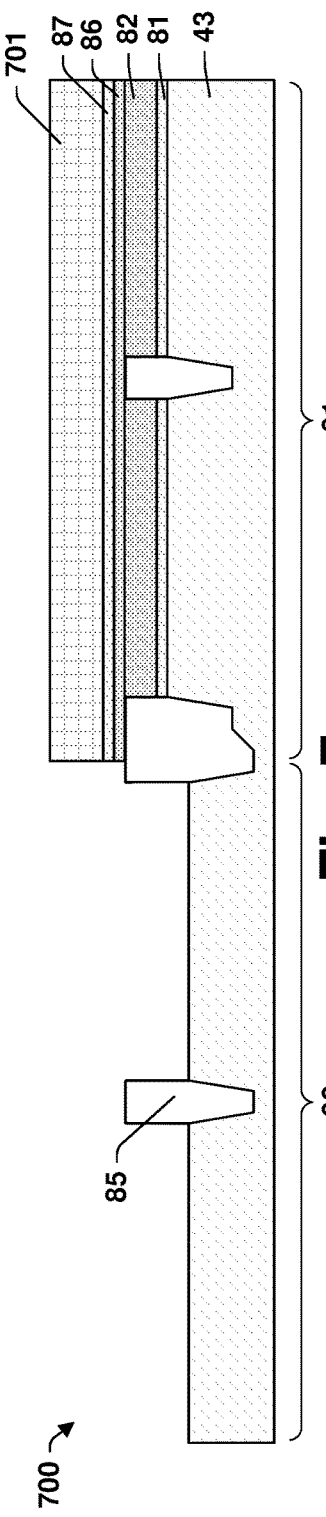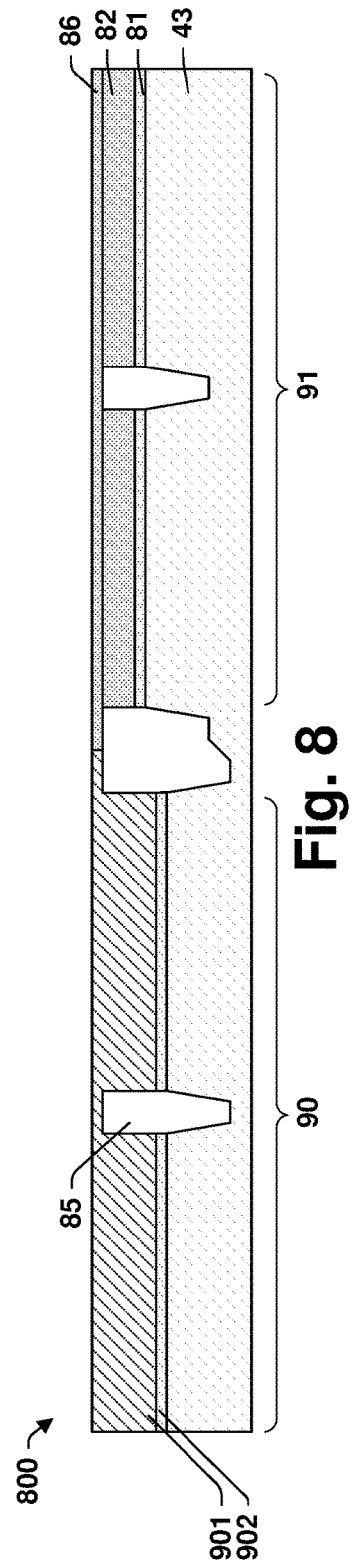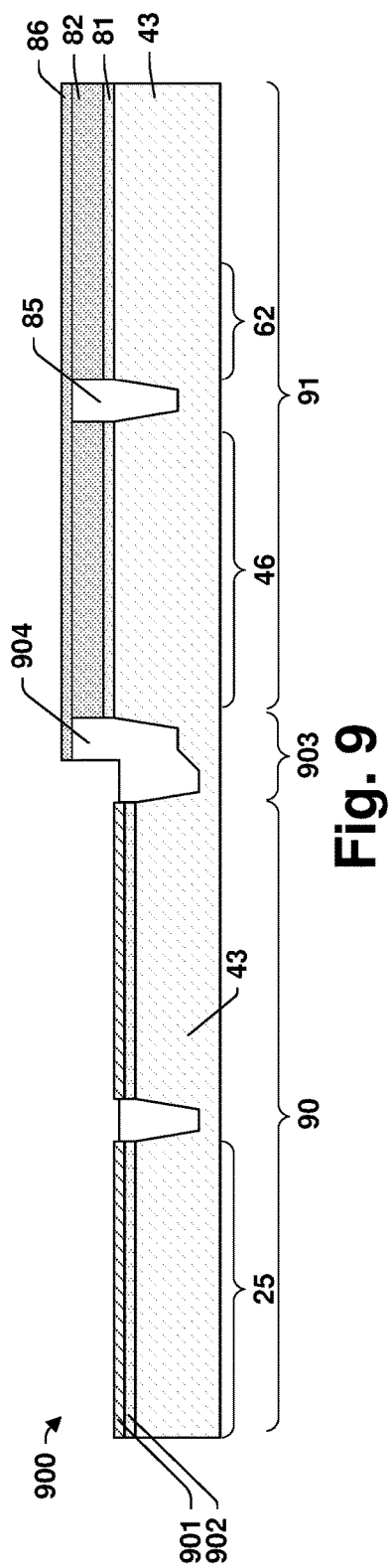

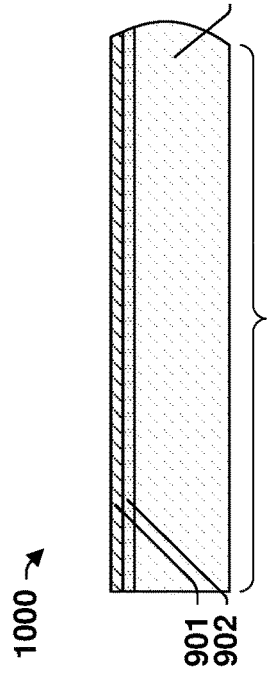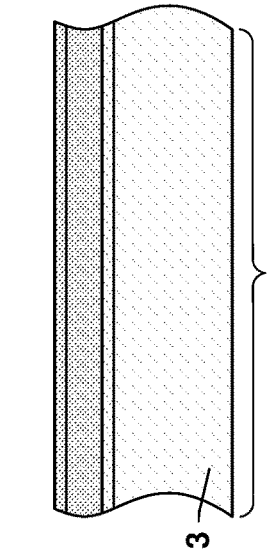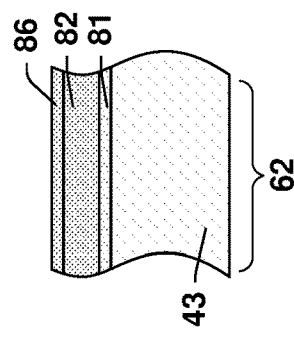
Fig. 10
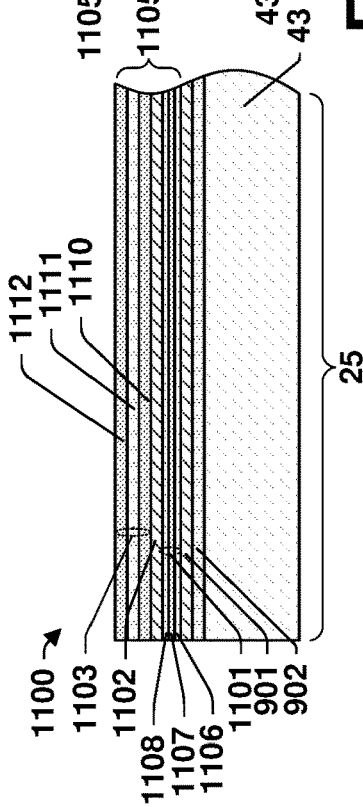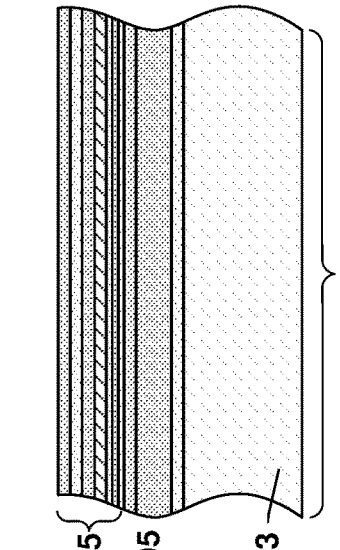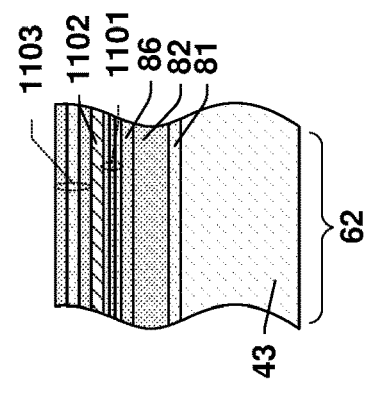
Fig. 11

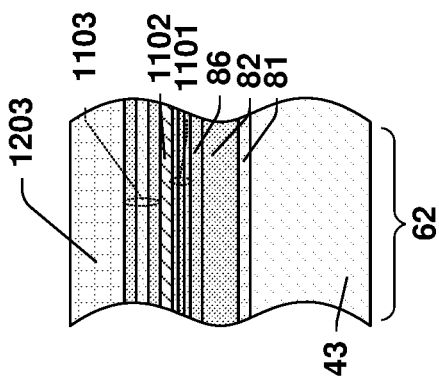
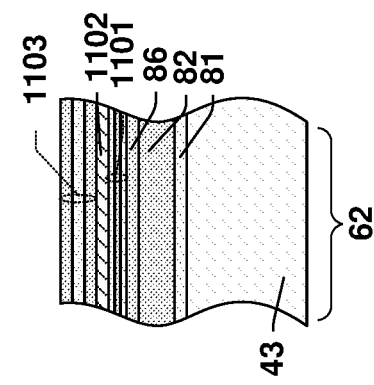
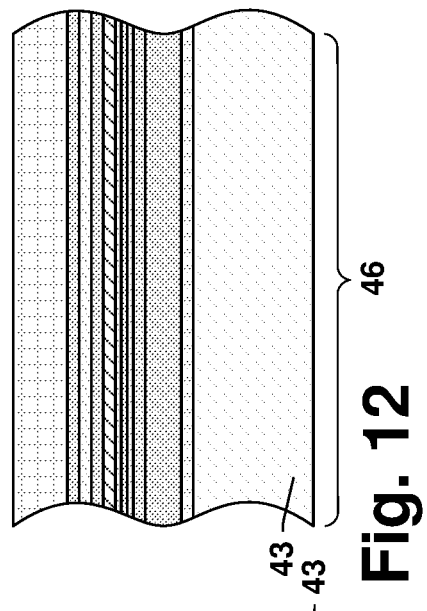
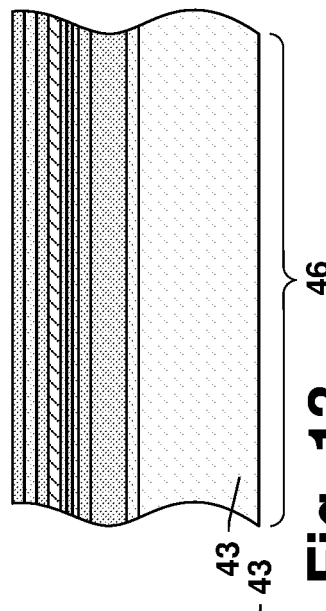
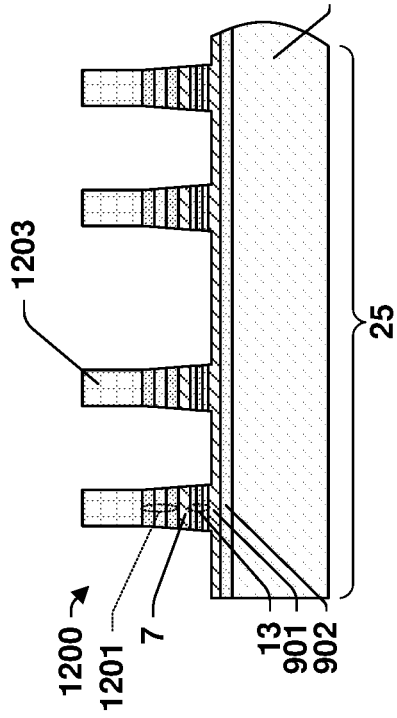
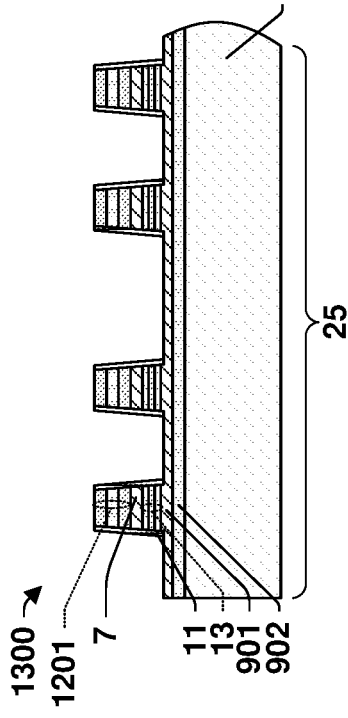
Fig. 12
Fig. 13

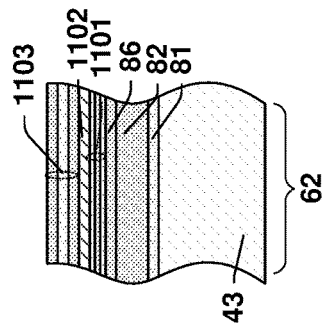
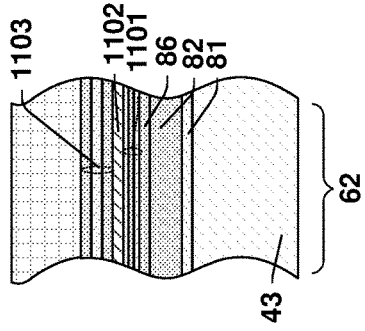
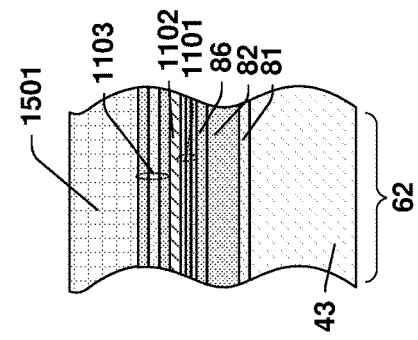
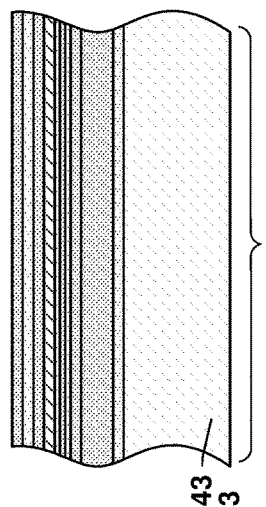
Fig. 14
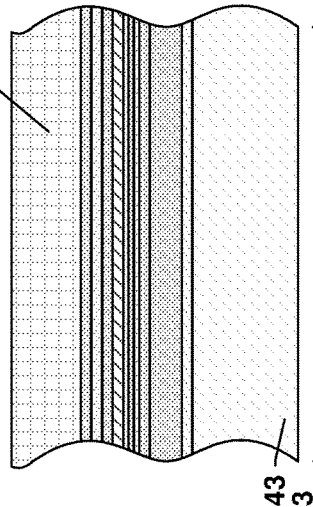
Fig. 15
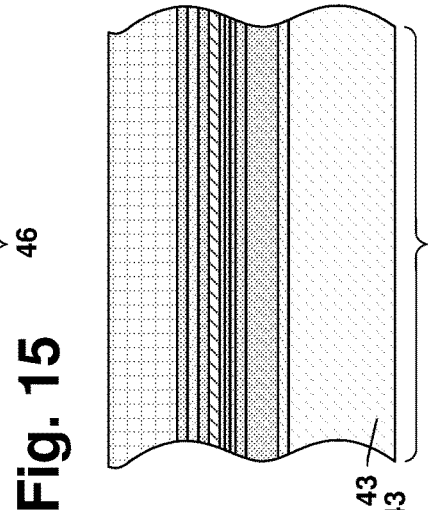
Fig. 16
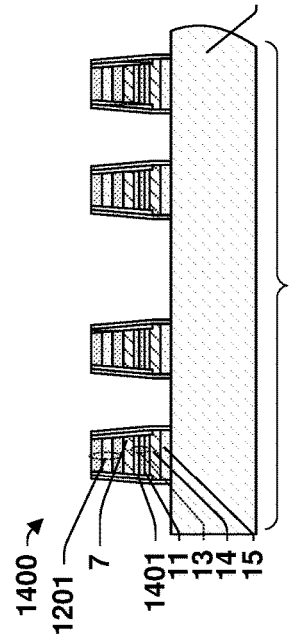
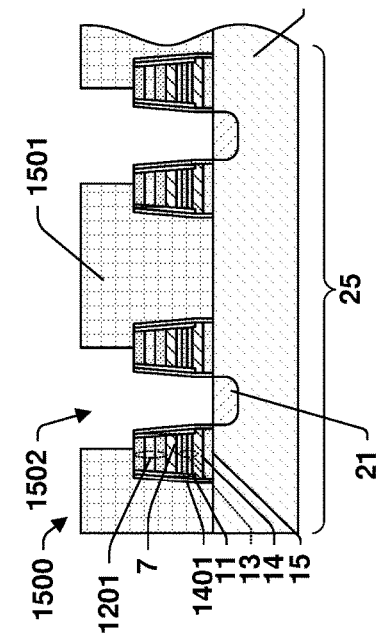
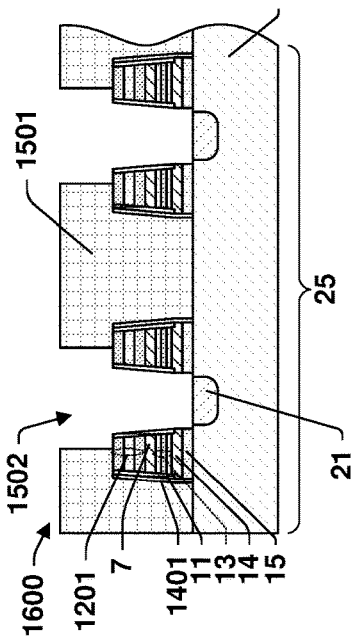

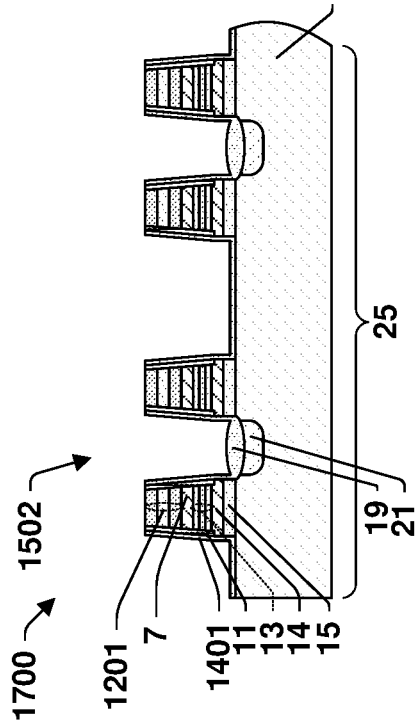
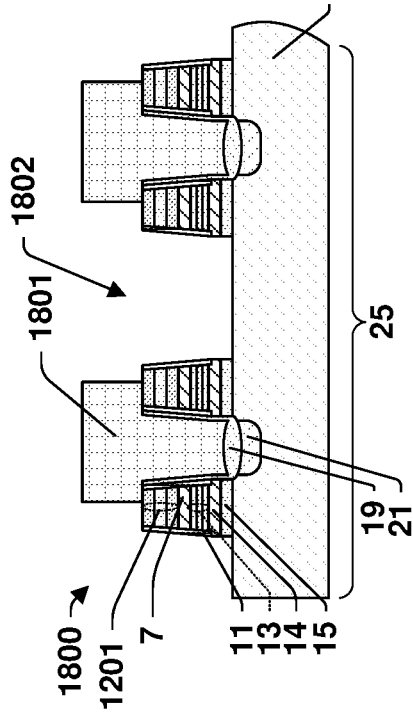
Fig. 17
Fig. 18

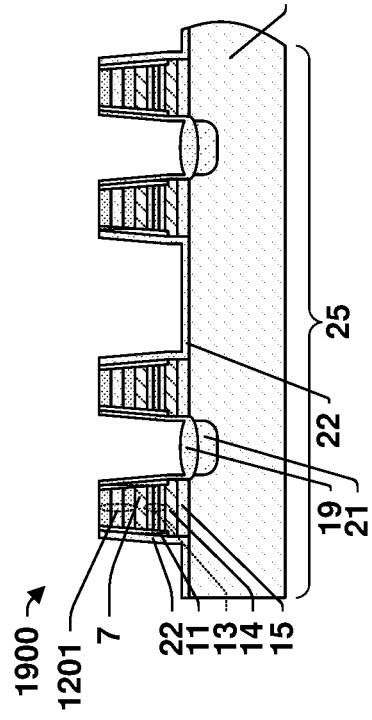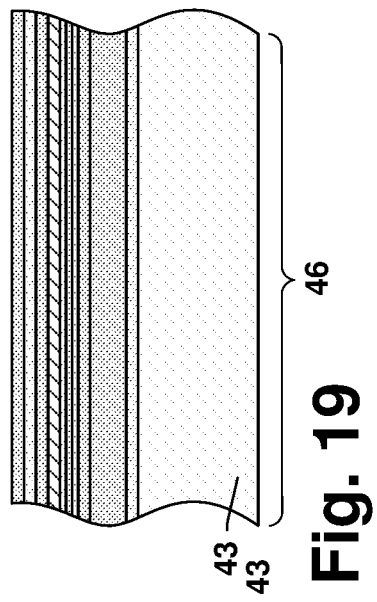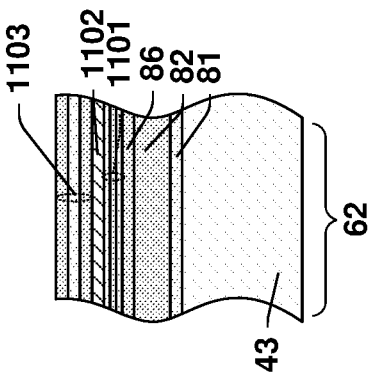
Fig. 19
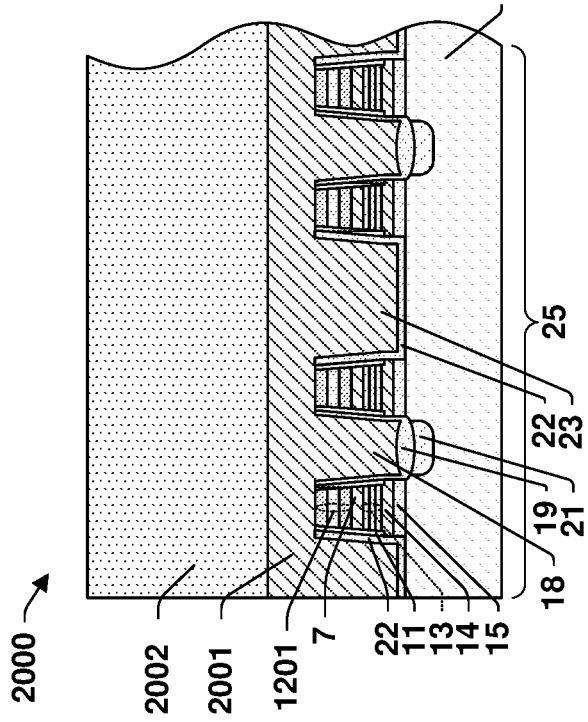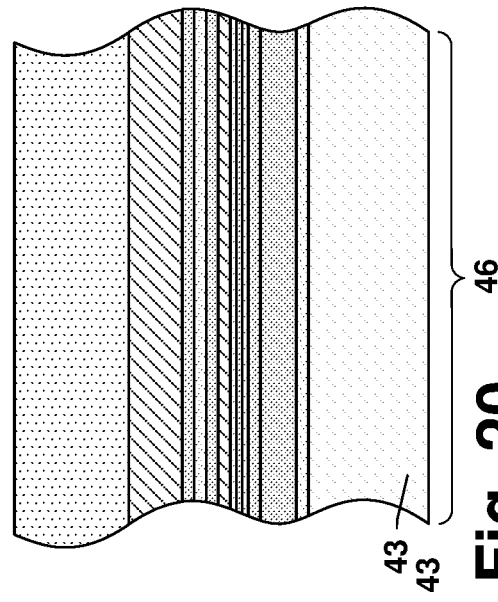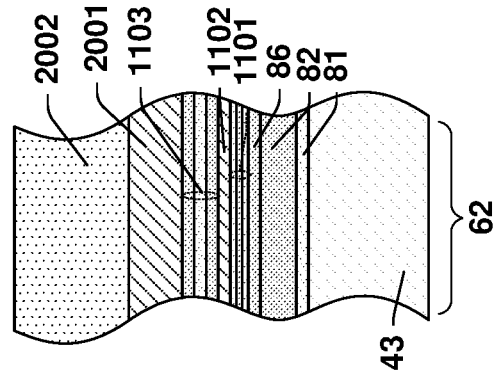
Fig. 20

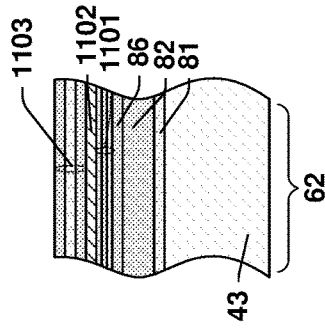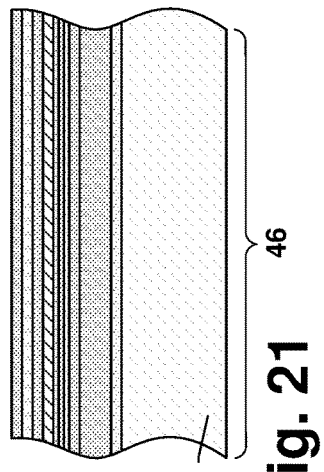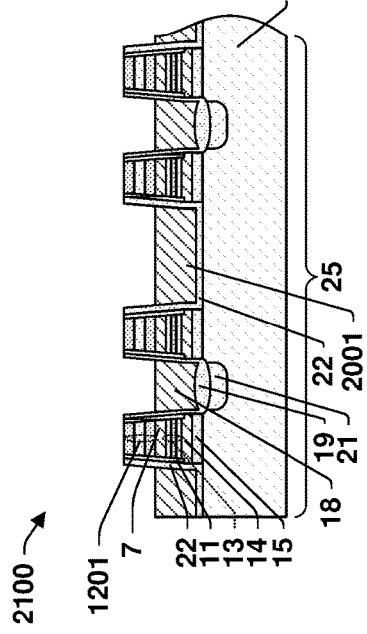
Fig. 21
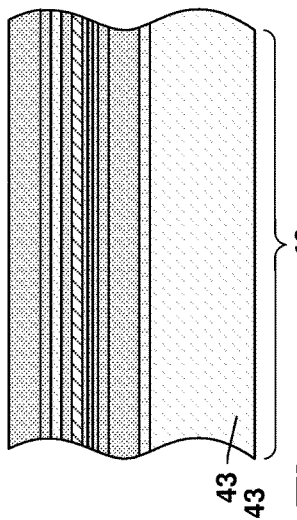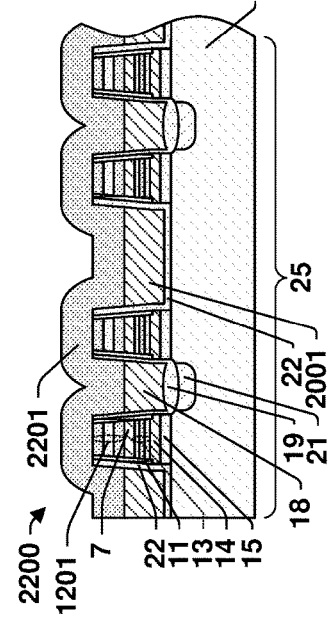
Fig. 22
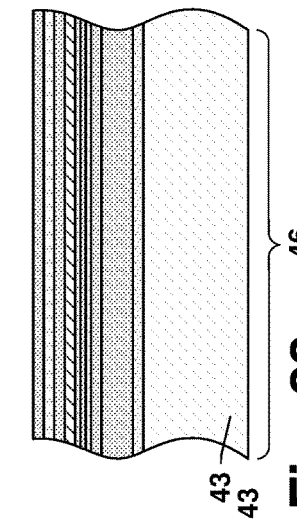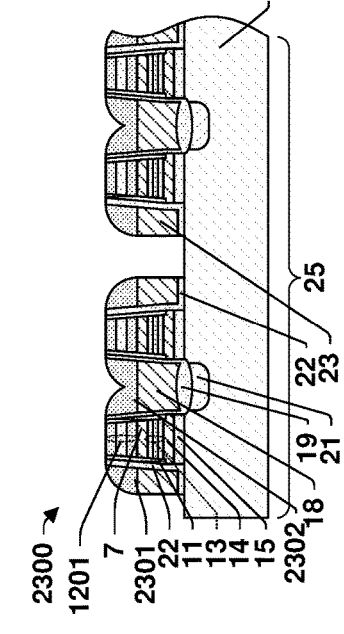
Fig. 23

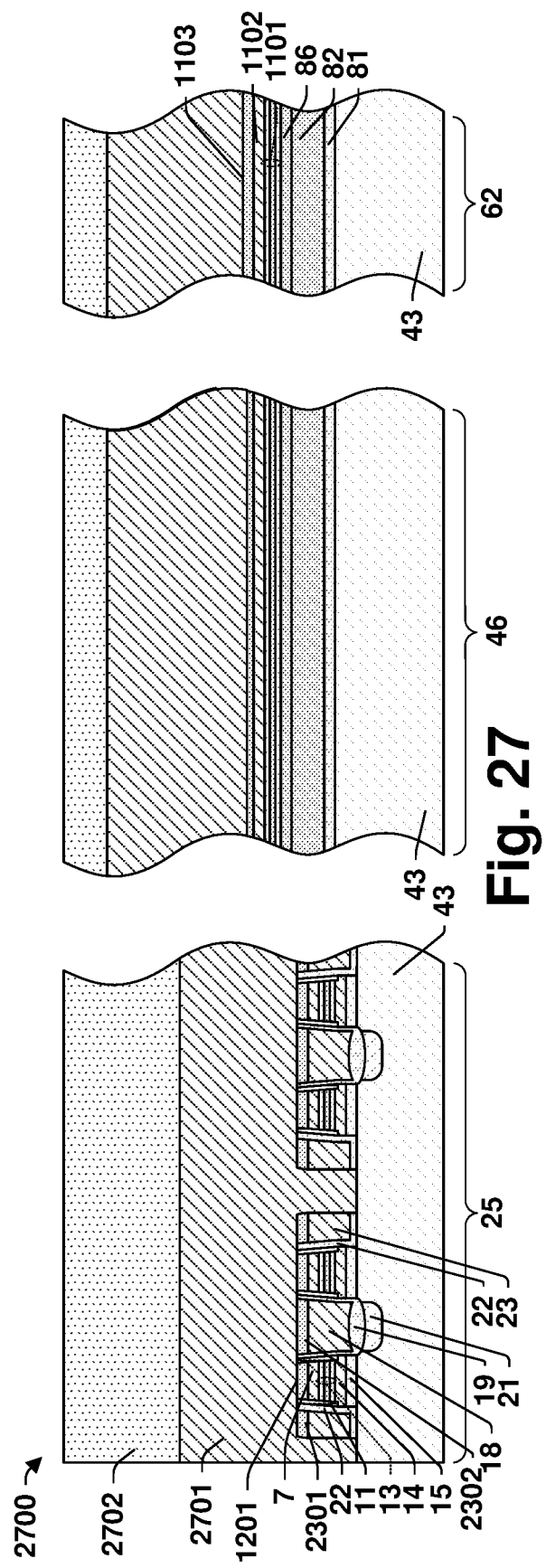
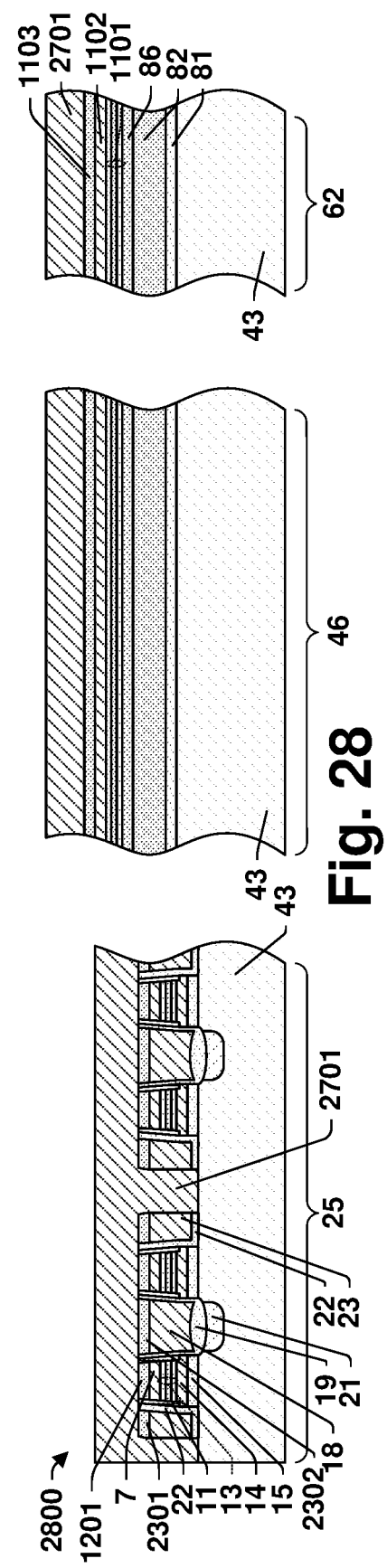
Fig. 27
Fig. 28

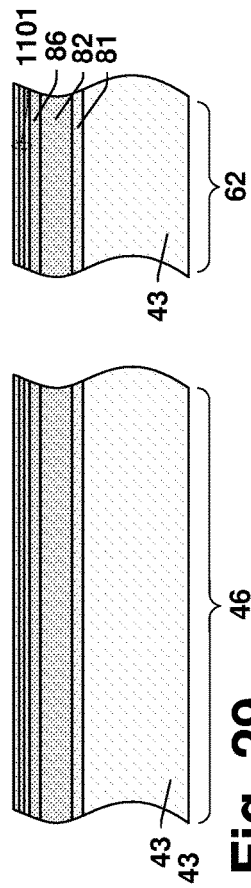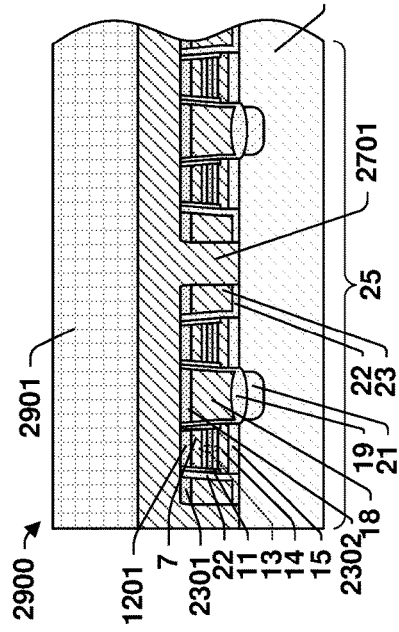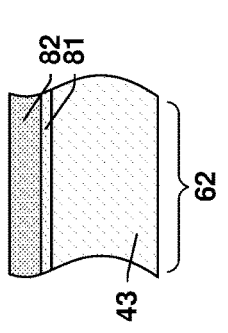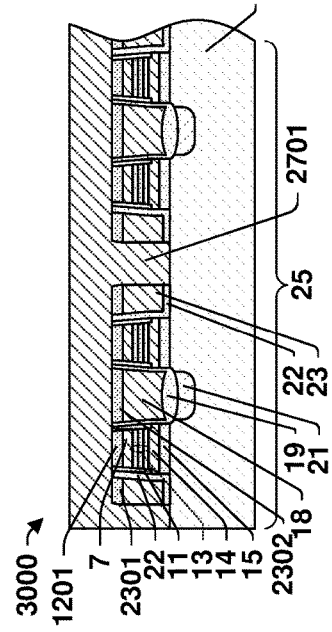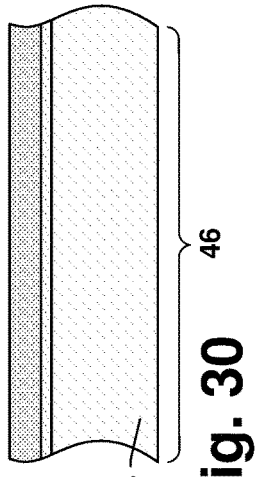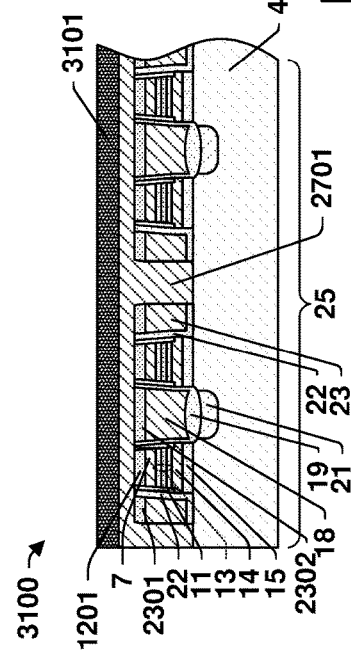

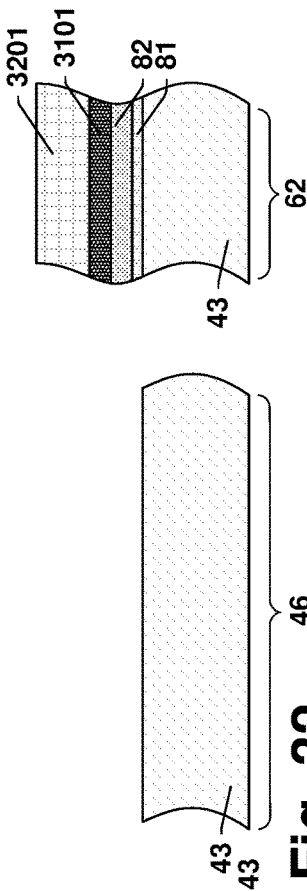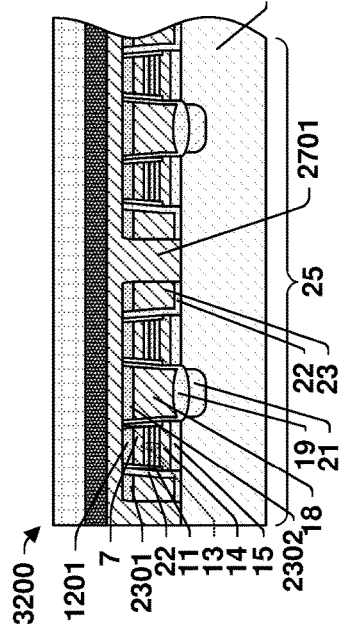
Fig. 32
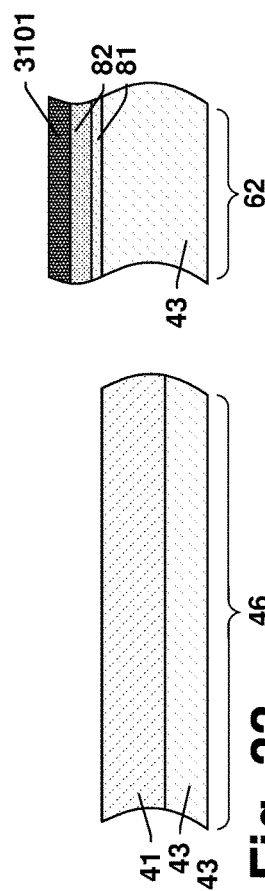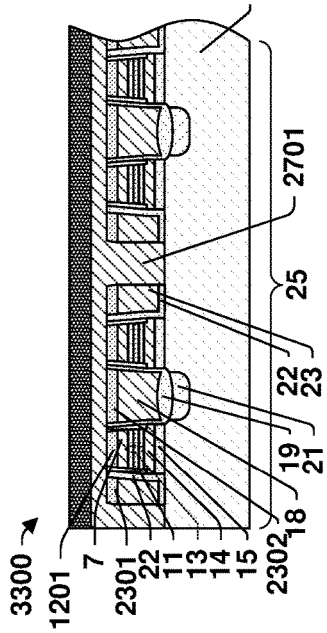
Fig. 33
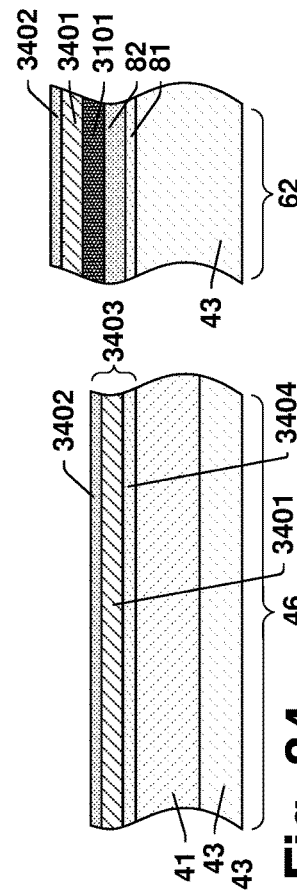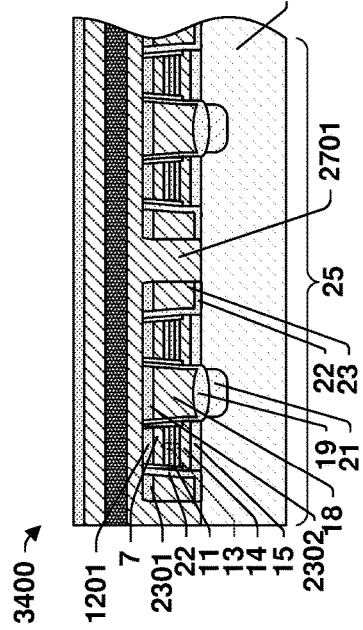
Fig. 34

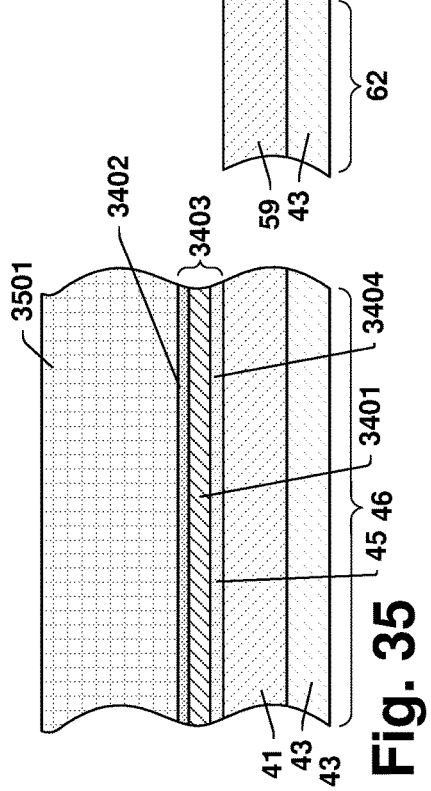
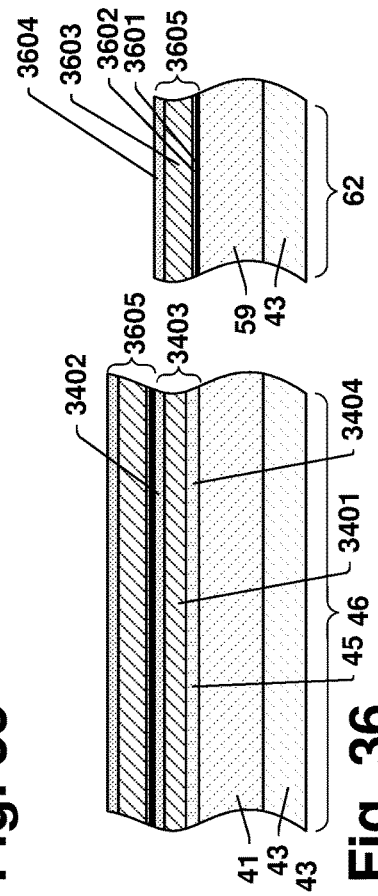
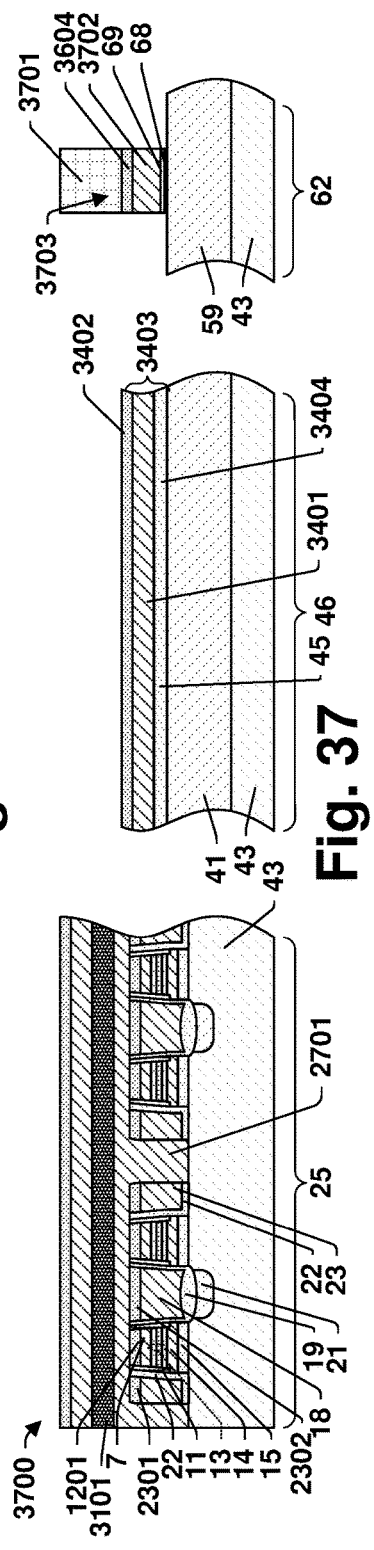
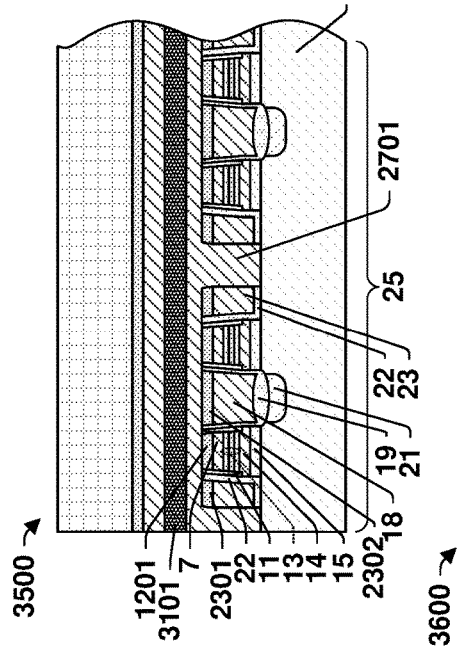
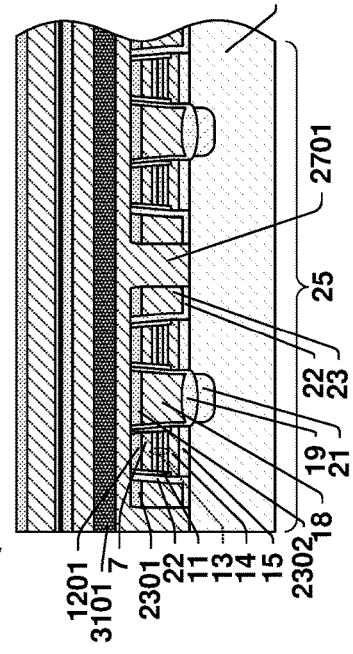
Fig. 35
Fig. 36
Fig. 37

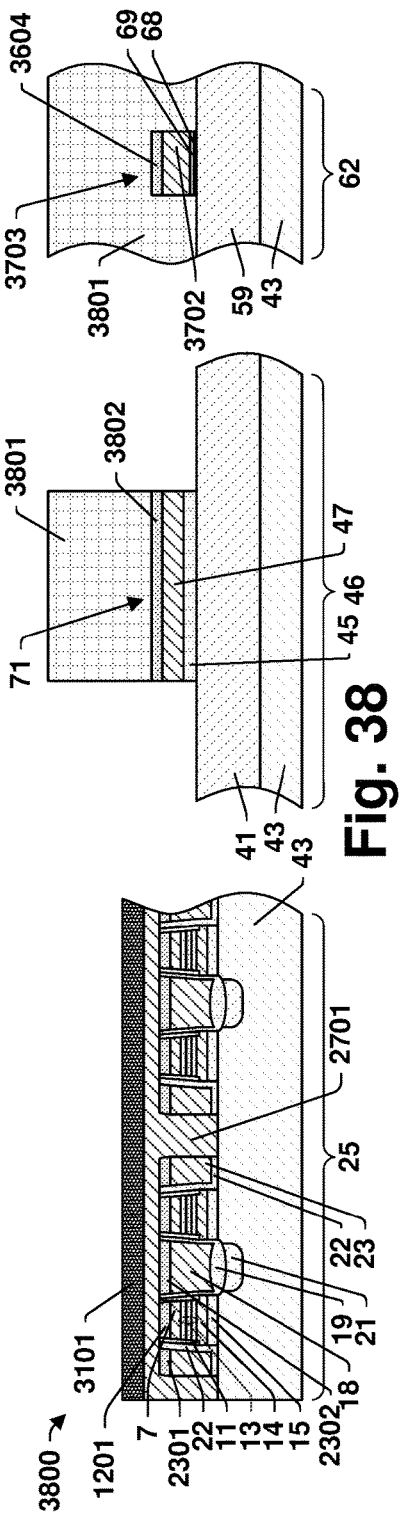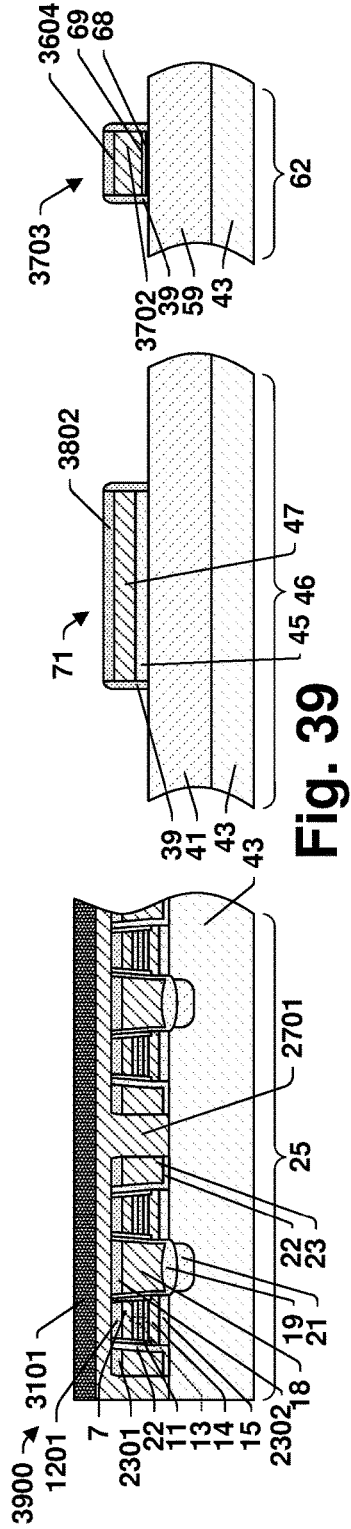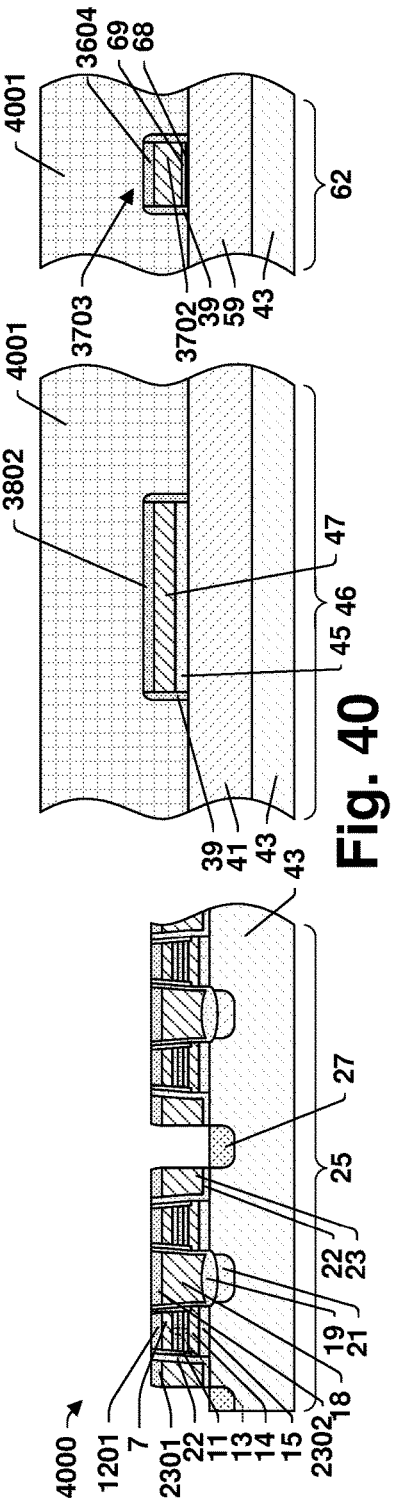

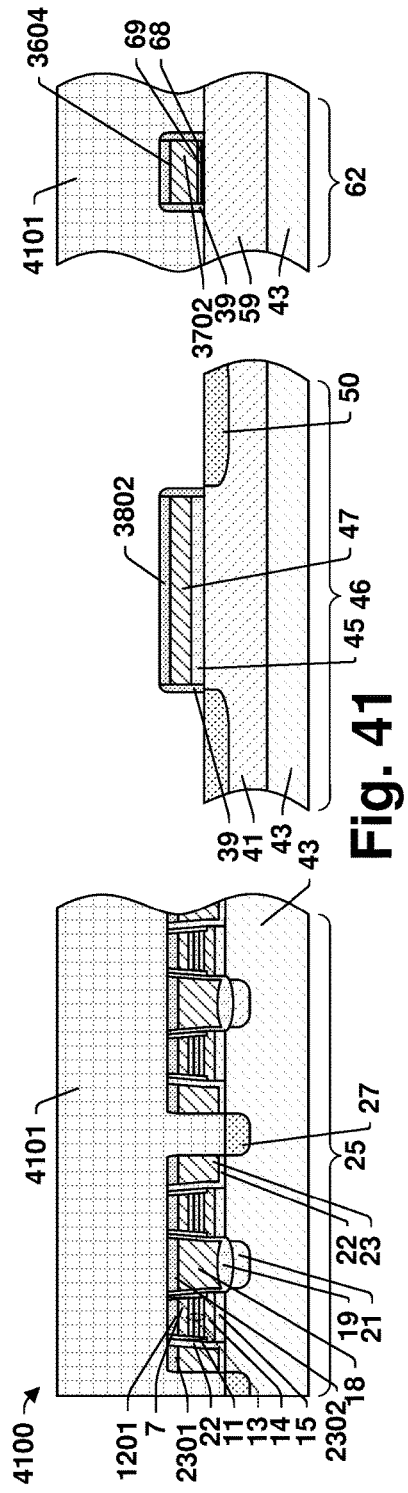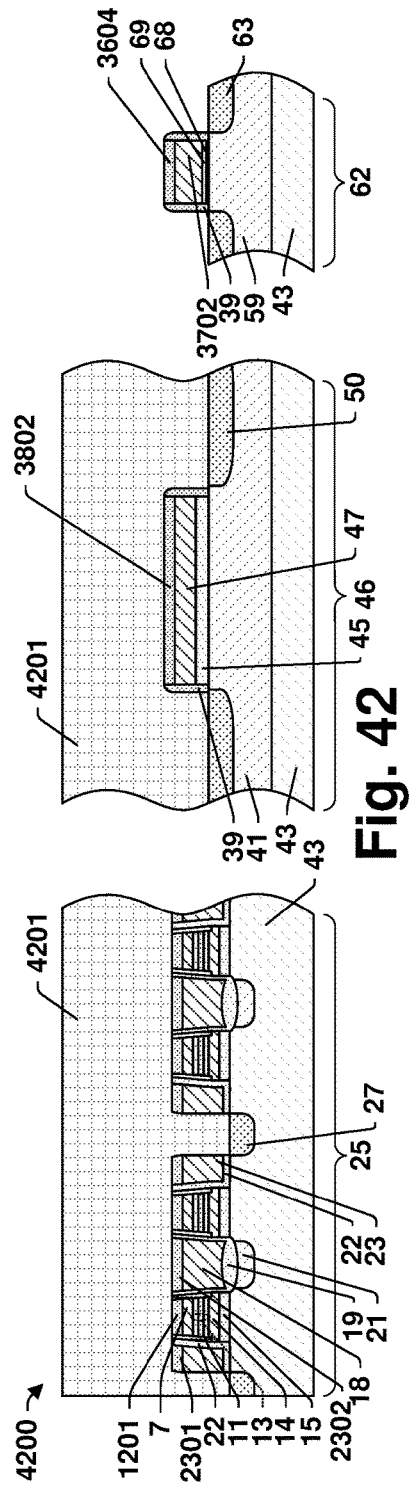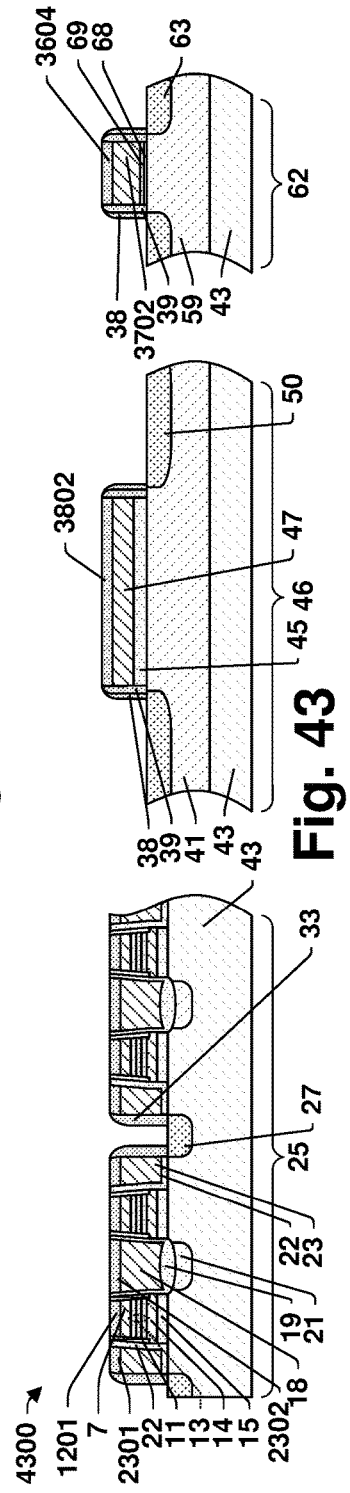

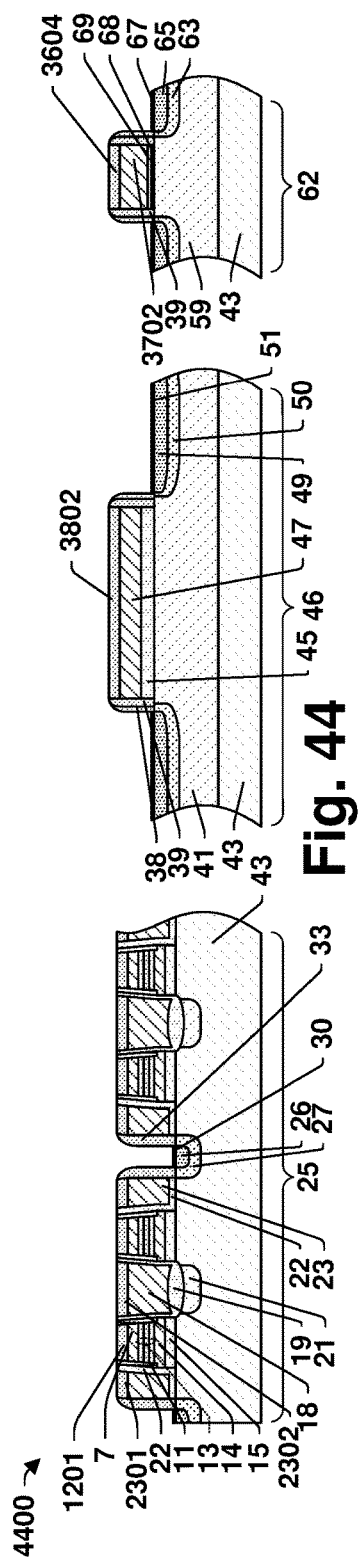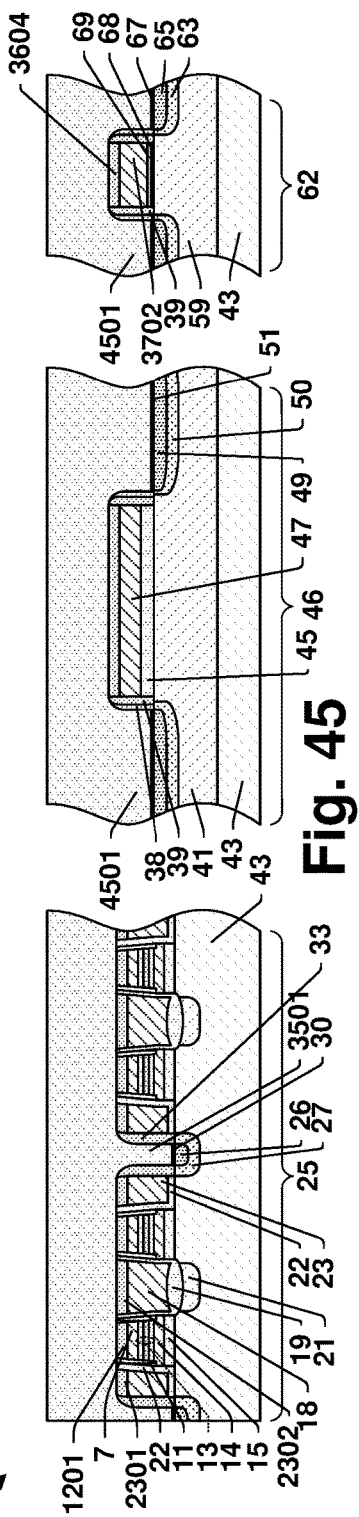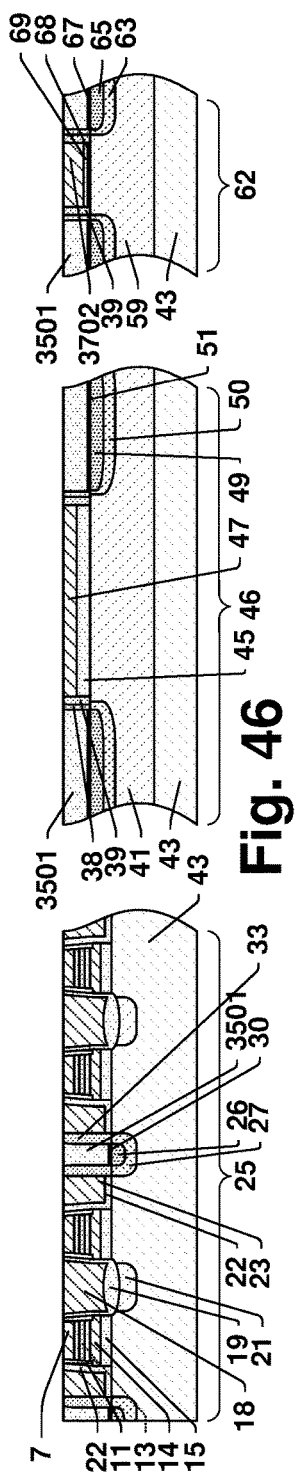

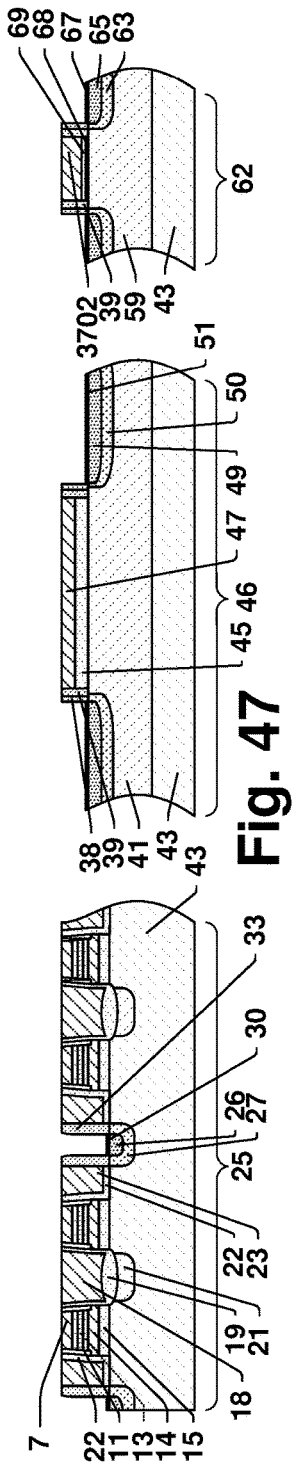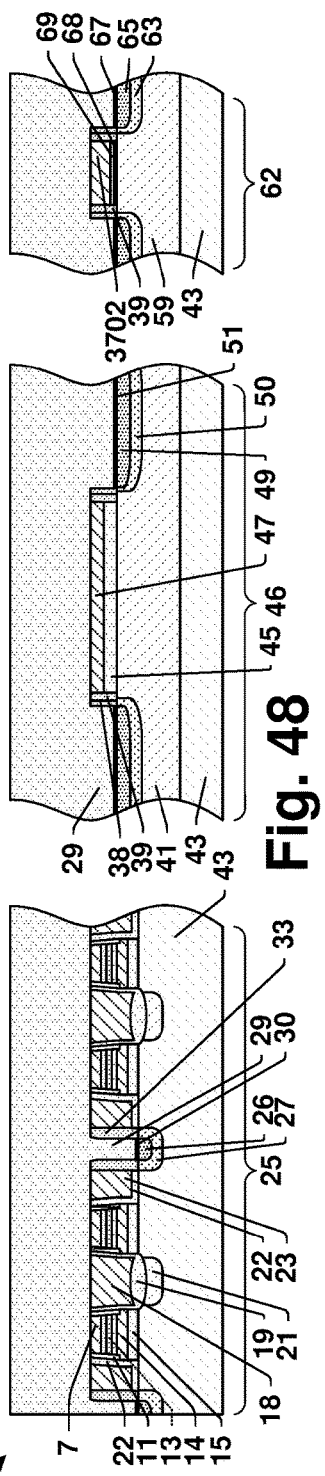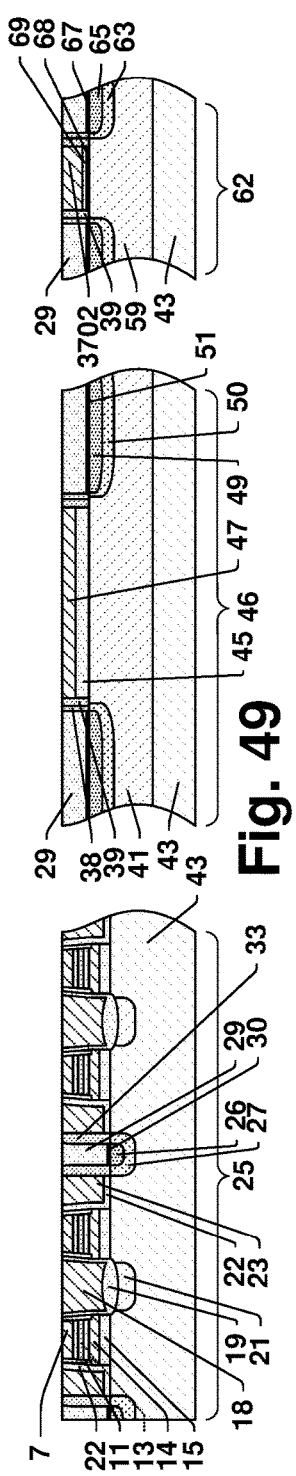

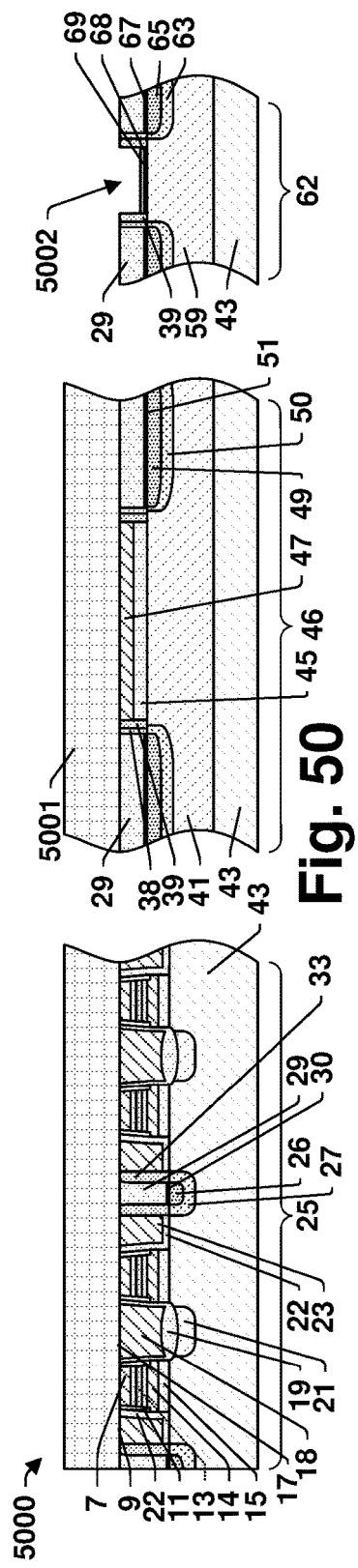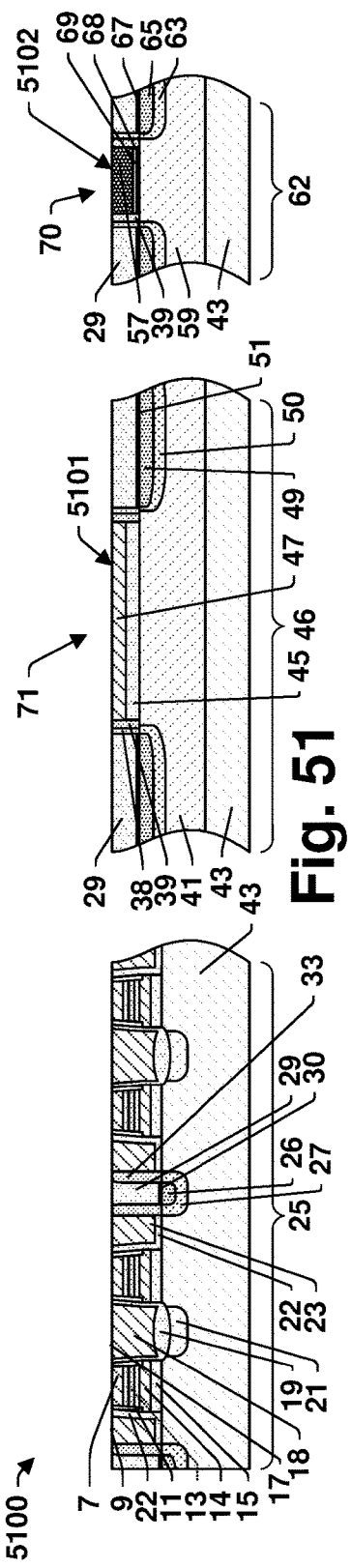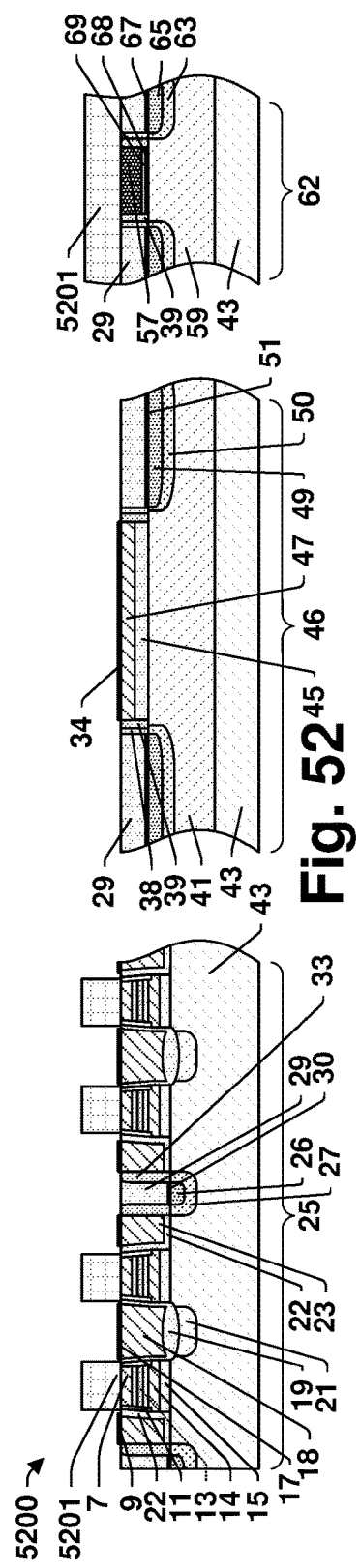

HIGH VOLTAGE POLYSILICON GATE IN HIGH-K METAL GATE DEVICE

REFERENCE TO RELATED APPLICATION

This application is a Continuation of U.S. application Ser. No. 16/535,431, filed on Aug. 8, 2019, the contents of which are hereby incorporated by reference in their entirety.

BACKGROUND

The integrated circuit (IC) manufacturing industry has experienced exponential growth over the last few decades. As ICs have evolved, functional density (i.e., the number of interconnected devices per chip area) has increased while feature sizes have decreased. Other advances have included the introduction of embedded memory technology and high-κ metal gate (HKMG) technology. Embedded memory technology is the integration of memory devices with logic devices on the same semiconductor chip. The memory devices support operation of the logic devices and improve performance in comparison to using separate chips for the different types of devices. High-κ metal gate (HKMG) technology is the manufacture of semiconductor devices using metal gate electrodes and high-κ gate dielectric layers.

BRIEF DESCRIPTION OF THE DRAWINGS

Aspects of the present disclosure are best understood from the following detailed description when read with the accompanying figures. In accordance with standard industry practice, features are not drawn to scale. Moreover, the dimensions of various features within individual drawings may be arbitrarily increased or reduced relative to one-another to facilitate illustration or provide emphasis.

FIG. 1 illustrates a cross-sectional view of an integrated circuit (IC) according to some aspects of the present disclosure.

FIGS. 2-52 illustrate a series of cross-sectional views of an IC according to some aspects of the present disclosure undergoing a manufacturing process according to some aspects of the present disclosure.

DETAILED DESCRIPTION

Figure 4:
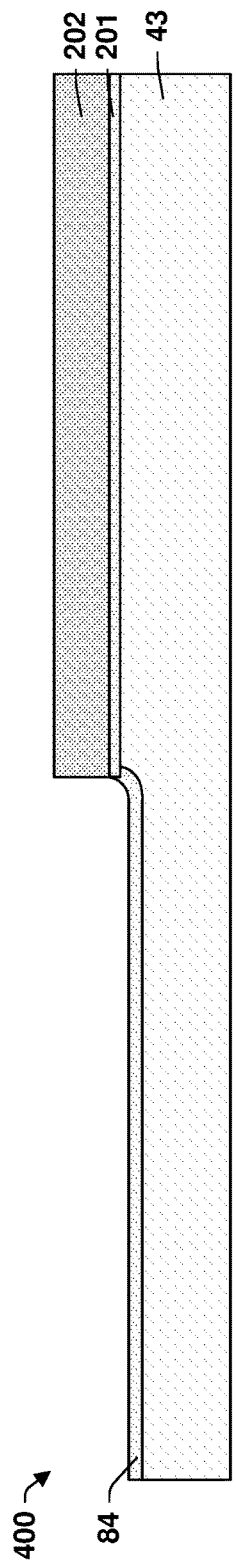

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Spatially relative terms, such as "beneath," "below," "lower," "above," "upper", and the like, may be used herein to describe one element or feature's relationship to another element(s) or feature(s) as illustrated in the figures. These spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may be interpreted accordingly. Terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

The present disclosure provides structures and manufacturing process for incorporating high voltage devices into device with HKMGs including those with embedded memory. The device with embedded memory may be a split gate flash memory device. In a split gate flash memory device, an array of memory cells is disposed in or over a semiconductor substrate. Peripheral circuitry, including logic devices such as address decoders and/or read write circuitry and/or microcontrollers, is arranged outside of the memory array and may control operation of the memory cells and/or perform other tasks. An isolation region with an isolation structure separates the memory array from the peripheral circuitry.

The present disclosure is particularly concerned with HKMG devices formed with a replacement gate or gate last process, which is a process in which the metal for the HKMG electrode is deposited after source/drain regions have been annealed. Source/drain regions are doped using a self-aligned process carried out after initial gate formation. Substrate doping is followed by annealing, which may be a heat treatment of at least 5 second at 1000° C. The high-κ dielectric and metal gate electrode interact under the heat treatment of annealing, which alters the threshold voltages of HKMG gates. A replacement gate process controls the threshold voltages of HKMG gates by doping source/drain regions by alignment with dummy gates. The dummy gates have dummy electrodes, which may be polysilicon, which are replaced by the desired gate metal after annealing has taken place.

In a replacement gate process, metal is deposited to fill the areas voided by removal of the dummy gate electrodes. This metal deposition is followed by chemical mechanical polishing (CMP) to remove the metal the deposits outside the gate areas. A limitation of this process is that gate metal is more susceptible to CMP than other materials which results in dishing that thins the metal gate electrodes. Some of this thinning may be offset by recessing the substrate relative to the isolation structures. But the thinning becomes more severe as the gate area increases, which result in a well-known design limit on the metal gate area. That limit is below 1 μm². That limit is a barrier to the introduction of high voltage devices into devices with HKMG gates.

According to the present teaching, the problem of incorporating high voltage devices into devices with HKMG gates is solved by implementing the high voltage devices using polysilicon gates with thick gate oxide. The polysilicon gates use conventional dielectrics as opposed to high-κ dielectrics. The problem of forming both high-κ dielectric and conventional dielectric gates is solved by a process that includes forming the thick gate oxide, depositing the polysilicon electrodes layer, covering the polysilicon electrode layer with a hard mask, etching those layers away from areas where HKMG gates are desired, depositing the dummy gate stacks, pattering the dummy gates, patterning the polysilicon gates, forming spacer adjacent the dummy gates, doping source/drain regions aligned to the spacers, and continuing with a replacement gate process. This process allows the high-κ dielectric to be etched from the polysilicon gate area without damaging the thick oxide.

FIG. 1 provides a cross-sectional view of selected portions of an IC device 1 according to some aspects of the present teachings. The portions include a portion of a memory region 25, a portion of a high voltage region 46, and a portion of a core region 62 all formed on a substrate 43. High voltage region 46 includes high voltage gates 71, core region 62 includes high-κ metal gates 70, and memory region 25 includes split gate flash memory cells 73. Although IC device 1 includes split gate flash memory cells 73 and the processes of the present disclosure are compatible with embedding flash memory, the present disclosure is applicable to IC devices without embedded memory.

High voltage gate 71 is a device operative with a high gate voltage. A high gate voltage may be a voltage greater than 5V. In some of these teachings, high voltage gate 71 is operative with a gate voltage of 10V or higher. In some of these teachings, high voltage gate 71 is operative with a gate voltage of 20V or higher.

High voltage gate 71 has a thick layer of oxide that forms all or part of high voltage gate dielectric 45. High voltage gate dielectric 45 may have a thickness of 100 Å or greater. In some of these teachings, high voltage gate dielectric 45 has a thickness of 300 Å or greater. In some of these teachings, high voltage gate dielectric 45 has a thickness of 500 Å or greater. High voltage gate dielectric 45 may include one or more layers of dielectrics. The area of substrate 43 immediately underneath high voltage gate dielectric 45 is channel region 74 of high voltage gate 71. High voltage gate dielectric 45 includes all the layers between channel region 74 and high voltage gate electrode 47. In accordance with some of the present teachings, none of the layers in high voltage gate dielectric 45 is a high-κ dielectric. A high-κ dielectric is one having a dielectric constant greater than about 7. IC device 1 may also include lower voltage gates, such as 5V gates, with the same or similar dielectric and electrode compositions as high voltage gate 71, but with thinner gate oxide.

High voltage gate 71 has high voltage gate electrodes 47 of polysilicon or the like. High voltage gate electrodes 47 may have any suitable thickness. In some of these teachings, the thickness of high voltage gate electrodes 47 is in the range from 300 Å to 1000 Å. High voltage gates 71 may be large area devices. A large area device is one having an area greater than 1 μm², that area being the area of high voltage gate electrode 47. In some of these teachings, high voltage gate 71 has a gate area of 3 μm² or greater. In some of these teachings, high voltage gate 71 has a gate area of 8 μm² or greater.

High voltage gate 71 may be formed over a deep well implant 41. Lightly doped high voltage gate source/drain areas 50 and heavily doped high voltage gate source/drain regions 49 may provide source/drain areas for high voltage gate 71 and may be aligned to spacers 38 and spacers 39 respectively. Heavily doped high voltage gate source/drain regions 49 may have silicide pads 51 at their surfaces. Silicide pads 34 may also be formed over high voltage gate electrodes 47.

HKMG gate 70 includes high-κ dielectric 69 and a metal gate electrode 57. A high κ dielectric may be a metal oxide or a silicate of hafnium (Hf), aluminum (Al), zirconium (Zr), lanthanum (La), magnesium (Mg), barium (Ba), titanium (Ti), lead (Pb), or the like. Examples of high κ dielectrics include $TiO_2$, $HfZrO$, $Ta_2O_3$, $HfSiO_4$, $ZrO_2$, and $ZrSiO_2$, or the like. High-κ dielectric 69 may have a thickness in the range from about 4 Å to about 100 Å. In some of these teachings, high-κ dielectric 69 has a thickness in the range from about 5 Å to about 25 Å. High-κ dielectric 69 may be separated from substrate 43 by oxide dielectric 68. Oxide dielectric 68 is a non-high κ dielectric. IC device 1 may include a variety of HKMG gates 70 having various thicknesses of oxide dielectric 68. Some HKMG gates may have oxide dielectric 68 in a thickness in the range from about 5 Å to about 25 Å. Other HKMG gates may have oxide dielectric 68 in a thickness in the range from about 25 Å to about 300 Å.

An upper surface of metal gate electrode 57 may be aligned with an upper surface of high voltage gate electrodes 47 with respect to distance above substrate 43. Metal gate electrode 57 may have any suitable thickness. In some of these teachings, the thickness of metal gate electrode 57 is in the range from 300 Å to 2000 Å. HKMG gate 70 may have a smaller area than high voltage gate 71. HKMG gate 70 has a gate area less than 1 μm².

HKMG gate 70 may be formed over a deep well implant 59. Lightly doped HKMG source/drain regions 63 and heavily doped HKMG source/drain regions 65 may provide source/drain areas for HKMG gate 70 and may be aligned to sidewall spacers 39 and second sidewall spacers 38 respectively. Heavily doped HKMG source/drain regions 65 may have silicide pads 51 at their surfaces. HKMG gate 70 may have been formed by a gate-last process. Accordingly, HKMG gate 70 has not been subject to condition required to anneal the implant in heavily doped HKMG source/drain regions 65. If HKMG gate 70 were subject to such conditions, high-κ dielectric 69 and metal gate electrode 57 would interact in a manner that would alter the threshold voltage of HKMG gate 70.

Split gate flash memory cells 73 include floating gate electrodes 14 separated from substrate 43 by floating gate dielectric 15, control gate electrodes 7 separated from floating gate electrodes 14 by control gate dielectric 13, erase gate electrodes 18 separated from substrate 43 by erase gate dielectric 19, and select gate electrodes 23 separated from substrate 43 and floating gate electrodes 14 by select gate dielectric 22. Heavily doped memory source/drain regions 26 are formed in substrate 43 by doping aligned to select gate sidewall spacers 33.

Various metallization layers may be formed above split gate flash memory cells 73, HKMG gate 70, and high voltage gate 71. These include a first metallization layer that includes metal lines 2 formed in dielectric 3. Dielectric 3 may be a low-κ dielectric. Additional metallization layer may be formed above the one shown. The metallization layers are coupled to source/drain regions by vias 31. Vias 31 pass through dielectric layers including an ILD0 layer 29 at the height of split gate flash memory cells 73, HKMG gate 70, and high voltage gate 71 and an ILD1 layer 5 above split gate flash memory cells 73, HKMG gate 70, and high voltage gate 71.

Substrate 43 is a semiconductor and may be or otherwise comprise, for example, a bulk silicon substrate, a SOI substrate, a group III-V substrate, another suitable semiconductor substrate(s). Substrate 43 may also be a binary semiconductor substrate (e.g., GaAs), a tertiary semiconductor substrate (e.g., AlGaAs), a higher order semiconductor substrate.

FIGS. 2-44 provide a series of cross-sectional views 600-4400 that illustrate an integrated circuit device according to the present disclosure at various stages of manufacture according to a process of the present disclosure. Although FIGS. 2-44 are described in relation to a series of acts, it will be appreciated that the order of the acts may in some cases be altered and that this series of acts are applicable to structures other than the ones illustrated. In some embodiments, some of these acts may be omitted in whole or in part. Furthermore, FIGS. 2-44 are described in relation to a series of acts, it will be appreciated that the structures shown in FIGS. 2-44 are not limited to a method of manufacture but rather may stand alone as structures separate from the method.

FIG. 2 provides a cross-sectional view 200 illustrating an initial step in which a pad oxide layer 201 and a pad nitride layer 202 are formed over substrate 43. A photoresist 203 may be formed and patterned to cover pad nitride layer 202 in a periphery area 91. Photoresist 203 may be used to selectively etch pad nitride layer 202 from memory area 90 as illustrated by cross-sectional view 300 of FIG. 3. As further illustrated by cross-sectional view 300 of FIG. 3, after stripping photoresist 203 an oxidation process may be carried out to recess substrate 43 in memory area 90. Recessing substrate 43 in area 90 allows the top of split gate flash memory cells 73 to align with tops of HKMG gate 70 and high voltage gate 71 in spite of split gate flash memory cells 73 having a greater height. The oxidation process produces the oxide layer 84. The oxidation process may be a wet oxidation process. Alternatively, the oxidation may be accomplished with a dry oxidation, steam oxidation, or some other suitable process.

Oxide layer 84 may be thinned to approach the thickness of pad oxide layer 201 as illustrated by cross-sectional view 400 of FIG. 4. The original pad oxide layer 201 and pad nitride layer 202 may then be stripped and replaced with pad oxide layer 81 and pad nitride layer 82 as illustrated by cross-sectional view 500 of FIG. 5. Isolation regions 85 may then formed by laying down a patterned mask, etching through pad oxide layer 81, pad nitride layer 82, and into substrate 43, forming the oxide of isolation regions 85 by depositing the oxide or an oxide precursor. After the oxide is formed, chemical mechanical polishing (CMP) may be used to produce the level surface shown by cross-sectional view 500 of FIG. 5.

Figure 6:
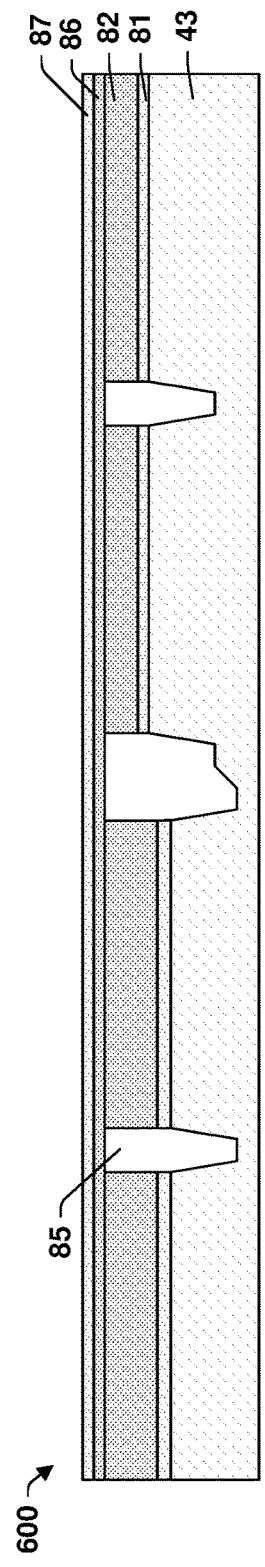

As illustrated by cross-sectional view 600 of FIG. 6, a nitride capping layer 86 and oxide capping layer 87 may then be formed. Oxide capping layer 87 may be a resist protective oxide, or some other suitable type of oxide. Alternative processing that does not include nitride capping layer 86 or oxide capping layer 87 is also feasible.

As illustrated by cross-sectional view 700 of FIG. 7, a photoresist 701 may be used to protect a peripheral area as the pad layers are removed from memory area 90. Photoresist 701 may then be stripped followed by deposition of floating gate dielectric layer 902 and floating gate electrode layer 901 and CMP to remove these layers and oxide capping layer 87 from periphery area 91 as illustrated by cross-sectional view 800 of FIG. 8. Floating gate dielectric layer 902 may be any suitable dielectric layer. Floating gate dielectric layer 902 may be grown on substrate 43 or deposited on substrate 43. Floating gate electrode layer 901 may be deposited conformally on floating gate dielectric layer 902 and may be doped polysilicon or the like. Floating gate electrode layer 901 may be formed by CVD, PVD, sputtering, or the like.

As illustrated by cross-sectional view 900 of FIG. 9, an etch process may then be carried out to reduce floating gate electrode layer 901 to a desired thickness. This etch back may be accomplished with a hydrofluoric acid (HF) dip or the like. FIG. 9 illustrates that memory area 90 and periphery area 91 are separated by a boundary region 903 with a boundary isolation structure 904. FIG. 9 also identifies memory region 25, which is an exemplary region within memory area 90. FIG. 9 further identifies high voltage region 46 and core region 62, which are two exemplary regions within periphery area 91 that undergo different types of processing. FIG. 10 illustrates a cross-sectional view 1000 that corresponds to cross-sectional view 900 of FIG. 9 except that it focuses on just these three as do the subsequent cross-sectional views.

As illustrated by cross-sectional view 1100 of FIG. 11, a control gate stack 1105 may be formed over floating gate electrode layer 901. Control gate stack 1105 includes control gate dielectric layer 1101, control gate electrode layer 1102, and control gate hard mask layer 1103. Control gate dielectric layer 1101 may include one or more layers of oxide, nitride, another suitable dielectric(s), or the like. Control gate dielectric layer 1101 may include multiple layers of different dielectrics. In some embodiments, control gate dielectric layer 1101 includes an ONO film having a lower oxide layer 1106, a middle nitride layer 1107 covering lower oxide layer 1106, and an upper oxide layer 1108 covering middle nitride layer 1107. Control gate dielectric layer 1101 may be formed by CVD, PVD, another suitable deposition process(es), any combination of the foregoing, or the like.

Control gate dielectric layer 1101 is very thin. Lower oxide layer 1106 may have a thickness in the range from 10-100 Angstroms. In some embodiments, lower oxide layer 1106 has a thickness in the range from 20-50 Angstroms, e.g., about 40 Angstroms. Middle nitride layer 1107 may have a thickness in the range from 25-200 Angstroms. In some embodiments, middle nitride layer 1107 has a thickness in the range from 50-100 Angstroms, e.g., about 80 Angstroms. Upper oxide layer 1108 may have a thickness in the range from 10-100 Angstroms. In some embodiments, upper oxide layer 1108 has a thickness in the range from 20-50, e.g., about 40 Angstroms. In some embodiments, the total thickness of control gate dielectric layer 1101 is in the range from 25-400 Angstroms. In some embodiments, the total thickness of control gate dielectric layer 1101 is in the range from 50-200 Angstroms.

Control gate electrode layer 1102 may be formed conformally and may be formed of doped polysilicon or the like. In some embodiments, a process of forming control gate electrode layer 1102 includes depositing a material, implanting dopants into the material, and annealing to activate the dopants. The material of control gate electrode layer 1102 may be deposited by CVD, PVD, or another suitable deposition process(es). In some embodiments, control gate electrode layer 1102 has a thickness in the range from 600-2000 Angstroms. In some embodiments, control gate electrode layer 1102 has a thickness in the range from 300-1000 Angstroms. In some embodiments, control gate electrode layer 1102 has a thickness of about 600 Angstroms.

Control gate hard mask layer 1103 may include multiple layers of differing materials. Control gate hard mask layer 1103 may include oxide, nitride, or other suitable materials. In some embodiments, control gate hard mask layer 1103 includes an oxide layer 1111 over a first nitride layer 1110. In some embodiments, the thicknesses of these layers are in the range from 100 to 3000 Angstroms. In some embodiments, the thicknesses of these layers are in the range from 200 to 700 Angstroms for example. In some embodiments, these layers are about 400 Angstroms thick. In some embodiments, control gate hard mask layer 1103 further includes a second nitride layer 1112 over oxide layer 1111. Control gate hard mask layer 1103 may be formed by CVD, PVD, another suitable deposition process(es), any combination of the foregoing, or the like.

As illustrated by the cross-sectional view 1200 of FIG. 12, a selective etch may be performed to remove portions of control gate stack 1105 from memory region 25, thereby forming a control gate hard masks 1201, control gate electrodes 7, and control gate dielectric 13 over floating gate electrode layer 901. In some embodiments, a process for performing the selective etch includes forming and patterning a photoresist layer 1203. Photoresist layer 1203 may be patterned to cover high voltage region 46, core region 62, and portions of memory region 25 that form a negative image of control gate electrodes 7. Etch processes may then be applied with photoresist layer 1203 in place until floating gate electrode layer 901 is exposed. Photoresist layer 1203 may then be stripped.

As illustrated by the cross-sectional view 1300 of FIG. 13, control gate spacers 11 may be formed adjacent control gate hard masks 1201. Control gate spacers 11 cover sidewalls of control gate electrodes 7. Control gate spacers 11 may be formed by depositing a layer of spacer material followed by etching. Control gate spacers 11 may have any suitable composition. Control gate spacers 11 may include one or more layers of oxide, nitride, another suitable dielectric(s), or the like. In some embodiments, control gate spacers 11 include ONO films, for example, a lower oxide layer, a middle nitride layer, and an upper oxide layer. The spacer material may be deposited by CVD, PVD, or another suitable deposition process(es). The etch process may include plasma etching or any other suitable etch process(es) that selectively removes the spacer material where it is thinnest with respect to the vertical. Control gate spacers 11 are shown with vertical sidewalls for ease of illustration. The etch process of spacer formation may produce rounded corners and smoothly tapering sidewalls.

As illustrated by the cross-sectional view 1400 of FIG. 14, an etch may be performed into floating gate electrode layer 901 and floating gate dielectric layer 902 (see FIG. 13) to form floating gate electrodes 14 and floating gate dielectric 15. Control gate spacers 11 and control gate hard masks 1201 may serve as a mask for this etch. As further illustrated by the cross-sectional view 1400 of FIG. 14, floating gate spacers 1401 may be formed on sidewalls of floating gate electrodes 14 and control gate spacers 11. Floating gate spacers 1401 may be oxide, another suitable dielectric(s), or the like. A process of forming floating gate spacers 1401 may include depositing a floating gate spacer layer over the structure illustrated by the cross-sectional view 1400 of FIG. 14 followed by plasma etching or any other suitable etch process(es) that selectively removes the floating gate spacer layer where it is thinnest with respect to the vertical. The floating gate spacer layer may be deposited conformally by CVD, PVD, or another suitable deposition process(es).

As illustrated by the cross-sectional view 1500 of FIG. 15, lightly doped memory source/drain regions 21 may be formed in substrate 43 laterally between floating gate electrodes 14. A process of forming lightly doped memory source/drain region 21 may include forming and patterning a photoresist layer 1501 covering high voltage region 46, core region 62, and portions of memory region 25 outside common source/drain gaps 1502. Ion implantation or another suitable doping process(es) may be performed with photoresist layer 1501 in place. Photoresist layer 1501 may be patterned using photolithography.

As illustrated by the cross-sectional view 1600 of FIG. 16, floating gate spacers 1401 within common source/drain gap 1502 may be removed. A process for removing floating gate spacers 1401 may include etching with photoresist layer 1501 in place. Photoresist layer 1501 may thereafter be stripped.

As illustrated by the cross-sectional view 1700 of FIG. 17, erase gate dielectric 19 may be formed to cover memory source/drain region 21 and line sidewalls of floating gate electrodes 14 and control gate spacers 11 within common source/drain gap 1502. Erase gate dielectric 19 may be formed of oxide, nitride, or another suitable dielectric(s). A process of forming erase gate dielectric 19 may include high temperature oxidation (HTO), in situ steam generation (ISSG) oxidation, another suitable deposition or growth process(es), any combination of the foregoing, or the like. In some embodiments, erase gate dielectric 19 is formed with a by an oxide deposition process followed by an oxide growth process. In some embodiments, erase gate dielectric 19 develops a curved or bulbous surface profile due to ion implantation in memory source/drain region 21. The central region of memory source/drain region 21 receives a larger dose of dopants and as a result undergoes more damage than the peripheral region of the memory source/drain region 21. The oxide may consequentially grow more rapidly in the central region as compared to the peripheral region.

As illustrated by the cross-sectional view 1800 of FIG. 18, a photoresist layer 1801 may be formed to cover high voltage region 46, core region 62, and portions of memory region 25 outside select gate gaps 1802 and used to remove floating gate spacers 1401 and erase gate dielectric 1701 (see cross-sectional view 1700 of FIG. 17) from within select gate gaps 1802. As illustrated by the cross-sectional view 1900 of FIG. 19, after removing photoresist layer 1801, select gate dielectric 22 may then be formed in select gate gaps 1802. Select gate dielectric 22 may be one or more layers of oxide, nitride, or another suitable dielectric(s), or the like. Select gate dielectric 22 may be formed by HTO, ISSG oxidation, another suitable deposition or growth process(es), any combination of the foregoing, or the like.

Also illustrated by the cross-sectional view 2000 of FIG. 20, a select gate electrode layer 2001 may be formed covering select gate dielectric 22 and other structures in high voltage region 46, core region 62, and memory region 25. Select gate electrode layer 2001 may be formed of doped polysilicon or the like, or another suitable conductive material(s) and may be formed by CVD, PVD, or another suitable deposition process(es). Cross-sectional view 2000 of FIG. 20 also illustrates a memory antireflective coating (ARC) 2002 formed over select gate electrode layer 2001. Memory ARC 2002 may be formed, for example, from a flowable organic material applied by a spin-on process wherein a wafer of substrate 43 is spun about its center while a liquid ARC coating is on the wafer surface. Because of its flowability, the liquid ARC coating tends to develop a level surface. After the liquid ARC coating is spun-on, a baking step may be carried out to harden memory ARC 2002.

As illustrated by the cross-sectional view 2100 of FIG. 21, a process(es) may be carried out to remove memory ARC 2002 (see FIG. 20) and to thin select gate electrode layer 2001. This process forms erase gate electrodes 18. The removal and thinning may be carried out with an etch process(es) for which memory ARC 2002 and select gate electrode layer 2001 have approximately equal susceptibilities. Memory ARC 2002 may be etched back until select gate electrode layer 2001 is exposed after which select gate electrode layer 2001 and memory ARC 2002 may be etched back together until memory ARC 2002 is completely removed. Select gate electrode layer 2001 may then be etched back until its top surface is about even with top surfaces of control gate electrodes 7. The etch process leaves the recessed select gate electrode layer 2001 with a substantially planar surface. Dopants may be implanted into or with the select gate electrode layer 2001 followed by an anneal to activate the dopants.

As illustrated by cross-sectional view 2200 of FIG. 22, a memory select gate hard mask layer 2201 may be formed conformally over the structure illustrated by cross-sectional view 2100 of FIG. 21. Memory select gate hard mask layer 2201 may be formed of nitride, oxide, or another suitable hard mask material(s). Memory select gate hard mask layer 2201 may be formed by CVD, PVD, or another suitable deposition process(es).

As illustrated by the cross-sectional view 2300 of FIG. 23, an etch may be used to form select gate hard masks 2301 and an erase gate hard masks 2302 from memory select gate hard mask layer 2201 (see FIG. 22). Select gate hard masks 2301 cover select gate electrodes 23. Erase gate hard masks 2302 covers erase gate electrodes 18. This etch process does not require a mask. The desired structure may be formed by removing memory select gate hard mask layer 2201 where it is thinnest with respect to the vertical.

Figure 24:
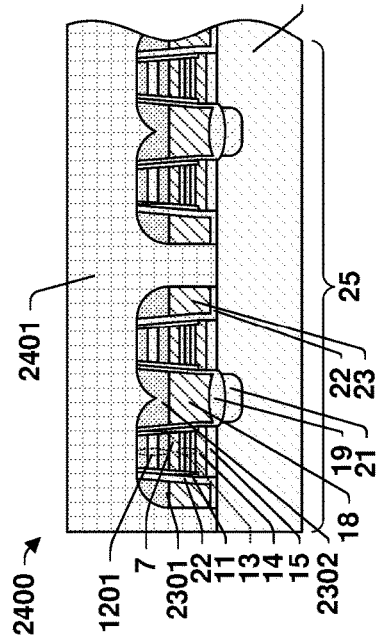

As illustrated by the cross-sectional view 2400 of FIG. 24, additional etching may be performed with a mask 2401 covering the illustrated portion of memory region 25. This additional etching may terminate conductive lines that are formed by some of the illustrated structures in the direction of the page. This etching may thin control gate hard mask layer 1103 over high voltage region 46 and core region 62.

Figure 25:
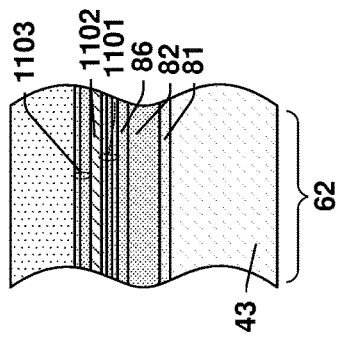

As illustrated by the cross-sectional view 2500 of FIG. 25, a second ARC 2501 may be formed over the structure illustrated by the cross-sectional view 2400 of FIG. 24. Second ARC 2501 may be formed with a top surface that is planar or substantially planar. Second ARC 2501 may be used in conjunction with a non-selective etch back process to recesses an uppermost portion of the structure illustrated by the cross-sectional view 2400 of FIG. 24 to produce the structure illustrated by cross-sectional view 2600 of FIG. 26. The etch back process may stop on or in control gate hard mask layer 1103, control gate hard masks 1201, and select gate hard masks 2301. After the etch back process, second ARC 2501 may be removed as shown by the cross-sectional view 2600 of FIG. 26.

Figure 26:
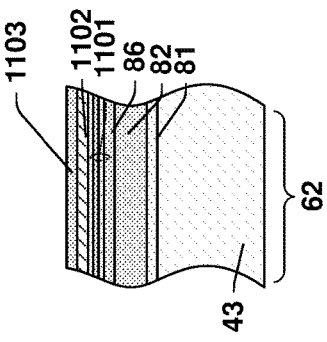

As illustrated by the cross-sectional view 2700 of FIG. 27, a memory capping layer 2701 may be formed over the structure illustrated by cross-sectional view 2600 of FIG. 26 and a bottom anti-reflective coating (BARC) 2702 may be formed over memory capping layer 2701. Memory capping layer 2701 may be polysilicon, although another suitable material(s) may be used instead. Memory capping layer 2701 may partially conform to the surface it covers. Memory capping layer 2701 may be formed by CVD, PVD, another suitable deposition process(es), any combination of the foregoing, or the like. BARC 2702 may be formed from a liquid coating that is spun on over memory capping layer 2701 to provide a top surface that is planar or substantially planar. After BARC 2702 is spun-on, a baking step may be carried out to harden the BARC 2702.

As illustrated by the cross-sectional view 2800 of FIG. 28, a process may be carried out to remove BARC 2702 (see FIG. 24) and leave memory capping layer 2701 with a recessed and relatively level surface. The process may be an etch under which BARC 2702 and memory capping layer 2701 have very similar etch rates. Initially, the etch proceeds through BARC 2702 until memory capping layer 2701 is exposed. The etch continues simultaneously etching BARC 2702 and memory capping layer 2701 until BARC 2702 is completely removed. This etch process may leave memory capping layer 2701 with a well-defined thickness over memory region 25.

As illustrated by the cross-sectional view 2900 of FIG. 29, a photoresist mask 2901 may be formed and patterned over memory capping layer 2701 in memory region 25. Like other photoresist masks, photoresist mask 2901 may be formed by a process that includes spin-coating or otherwise forming a photoresist on a surface of the structure, selectively exposing the photoresist to light through a reticle or other photolithographic mask, and removing the exposed or unexposed portion using a chemical developer. With mask 2901 in place, an etch may be performed to remove control gate electrode layer 1102 and control gate hard mask layer 1103 from high voltage region 46 and core region 62. After etching, photoresist mask 2901 may be removed. Like other photoresist masks, photoresist mask 2901 may be removed by full exposure and development, etching, ashing, or any other suitable removal process(es). As illustrated by the cross-sectional view 3000 of FIG. 30, additional etching may be performed to remove control gate dielectric layer 1101 and nitride capping layer 86 from high voltage region 46 and core region 62.

As illustrated by the cross-sectional view 3100 of FIG. 31, a hard mask 3101 may be formed over memory region 25, high voltage region 46, and core region 62. Hard mask 3101 may be silicon nitride, an oxide, or the like. As illustrated by the cross-sectional view 3200 of FIG. 32, a photoresist 3201 may be formed and patterned to cover memory region 25 and core region 62 while hard mask 3101, pad oxide layer 81, and pad nitride layer 82 are removed from high voltage region 46. As illustrated by the cross-sectional view 3300 of FIG. 33, photoresist 3201 may be removed and ion implantation used to form deep well implant 41 in high voltage region 46.

As illustrated by the cross-sectional view 3400 of FIG. 34, a high voltage gate stack 3403 may then be formed. High voltage gate stack 3403 includes thick gate oxide layer 3404, polysilicon electrode layer 3401, and high voltage gate hard mask 3402. Thick gate oxide layer 3404 may be grown from substrate 43 by a wet or dry oxidation process. Alternatively, thick gate oxide layer 3404 may be deposited by CVD or the like. Thick gate oxide layer 3404 may also be formed by a combination of oxidative growth and deposition. Polysilicon electrode layer 3401 may be deposited by CVD. Outside high voltage region 46, polysilicon electrode layer 3401 may deposit over hard mask 3101, which may facilitate later removal of polysilicon electrode layer 3401 from these other areas. In some embodiments, dopants are implanted into polysilicon electrode layer 3401 followed by an anneal to activate the dopants. Photoresist masks may be used to allow the dopant type to be varied between n-type and p-type or to otherwise allow the doping to be varied for differing regions and device types. High voltage gate hard mask 3402 is formed over polysilicon electrode layer 3401 and may be made from nitride, oxide, polysilicon, or the like.

As illustrated by the cross-sectional view 3500 of FIG. 35, after masking memory region 25 and high voltage region 46 with a photoresist 3501, high voltage gate hard mask 3402, hard mask 3101, polysilicon electrode layer 3401, pad oxide layer 81, and pad nitride layer 82 may be removed from core region 62. As further illustrated by the cross-sectional view 3500 of FIG. 35, ion implantation and annealing may then be carried out to form deep well implant 59 in core region 62.

As illustrated by the cross-sectional view 3600 of FIG. 36 a dummy gate stack 3605 may be formed over the structure illustrated by cross-sectional view 3500 of FIG. 35 after removal of photoresist 3501. Dummy gate stack 3605 may include an oxide layer 3601, a high-κ dielectric layer 3602, a dummy gate electrode layer 3603, and a dummy gate hard mask layer 3604. In general, the dummy gate stack dielectrics may include any suitable number and combination of dielectric layers and may be made with thickness and/or compositions that vary among different devices in core region 62. Dummy gate electrode layer 3603 may be polysilicon or the like or another suitable material(s). Dummy gate hard mask layer 3604 may be nitride, oxide, polysilicon, or the like. The layers of dummy gate stack 3605 may be formed conformally by CVD, PVD, electroless plating, electroplating, another suitable growth or deposition process(es), any combination of the foregoing, or the like. Oxide layer 3601 in particular may be grown on substrate 43.

As illustrated by the cross-sectional view 3700 of FIG. 37, a photoresist 3701 may be used to define dummy gate 3703 in core region 62 while oxide layer 3601, high-κ dielectric layer 3602, dummy gate electrode layer 3603, and dummy gate hard mask layer 3604 are removed from other locations. This etch forms oxide dielectric 68 from oxide layer 3601, high-κ dielectric 69 from high-κ dielectric layer 3602, and dummy gate electrode 3702 from dummy gate electrode layer 3603. This process may effectively remove high-κ dielectric layer 3602 from areas outside core region 62. High voltage gate hard mask 3402 and polysilicon electrode layer 3401 protect thick gate oxide layer 3404 during this processing.

As illustrated by the cross-sectional view 3800 of FIG. 38, a photoresist 3801 may be formed, patterned, and then used to mask core region 62 while selectively etching high voltage gate stack 3403 to form high voltage gate 71 and remove high voltage gate stack 3403 from memory region 25. This etching forms a high voltage gate hard mask 3802 from high voltage gate hard mask 3402, high voltage gate electrodes 47 from polysilicon electrode layer 3401, and high voltage gate dielectric 45 from thick gate oxide layer 3404. The selective etching may include a series of plasma etches to etch through the various layers. Photoresist 3801 may be removed at the conclusion of this process.

As illustrated by the cross-sectional view 3900 of FIG. 39, sidewall spacers 39 may then be formed along outer sidewalls of high voltage gate 71 and dummy gate 3703. Sidewall spacers 39 may be oxide, nitride, another suitable dielectric(s), any combination of the foregoing, or the like. Sidewall spacers 39 may be formed by depositing the spacer material followed by etching to remove the spacer material from where it is thinnest. The spacer material may be deposited conformally by CVD, PVD, another suitable deposition process(es), any combination of the foregoing, or the like. The spacer material may be etched to form sidewall spacers 39 by any suitable etch process.

As illustrated by the cross-sectional view 4000 of FIG. 40, a photoresist 4001 may then be used to mask high voltage region 46 and core region 62 while memory capping layer 2701 is etched from memory region 25. Dopants may then be implanted to form memory source/drain regions 27 in memory region 25. As illustrated by the cross-sectional view 4100 of FIG. 41, a photoresist 4101 may then be used to mask core region 62 and memory region 25 while lightly doped high voltage drain regions 50 are formed in high voltage region 46. Likewise, as illustrated by the cross-sectional view 4200 of FIG. 42, a photoresist 4201 may then be used to memory region 25 and high voltage region 46 while lightly doped core source/drain regions 63 are formed in core region 62.

As illustrated by the cross-sectional view 4300 of FIG. 43, second sidewall spacers 38 may then be formed adjacent high voltage gate 71 and dummy gate 3703. Optionally select gate sidewall spacers 33 may be formed adjacent select gate electrodes 23 at the same time. These spacers may be formed by conformally depositing spacer material and then etching until the material remains only where the spacers are desired.

As illustrated by the cross-sectional view 4400 of FIG. 44, heavily doped memory source/drain regions 26, heavily doped high voltage gate source/drain regions 49, and heavily doped HKMG source/drain regions 65 may then be formed in memory region 25, high voltage region 46, and core area 62 respectively. The doping may be carried out in a series of steps with various regions and sub-regions masked to provide a range of doping concentrations and types for various devices. After doping, annealing may be carried out to activate the dopants within substrate 43. As further shown in cross-sectional view 4400 of FIG. 44 a salicidation process may be carried out to form silicide pads 30 silicide pads 51, and silicide pads 67 on heavily doped memory source/drain regions 26, heavily doped high voltage gate source/drain regions 49, and heavily doped HKMG source/drain regions 65 respectively. The silicide may be nickel silicide, titanium silicide, cobalt silicide, another silicide(s), or the like and may be formed by any suitable salicing process(es).

As illustrated by the cross-sectional view 4500 of FIG. 45, a contact etch stop layer 8 and a second ARC 4501 may then be formed over the structure illustrated by the cross-sectional view 4400 of FIG. 44. Second ARC 4501 may be formed with a top surface that is planar or substantially planar. A process of forming the second ARC 4501 may include spinning on an organic ARC coating. As illustrated by the cross-sectional view 4600 of FIG. 46, a process may then be performed to remove an upper layer from the structure illustrated by cross-sectional view 4400 of FIG. 44. This may be a CMP process. In some embodiments, however, the removal is accomplished with etching using process(es) for which the various materials being removed have similar susceptibilities whereby the upper surface remains substantially planar. A suitable etch process may be a dry etch that includes plasma from fluorocarbon and He etchants.

As illustrated by the cross-sectional view 4700 of FIG. 47, second ARC 4501 may then be removed followed by formation of ILD0 layer 29 as illustrated by the cross-sectional view 4800 of FIG. 48. ILD0 layer 29 may be oxide, a low κ dielectric, another suitable dielectric(s), any combination of the foregoing, or the like. Second ARC 4501 may be removed by etching or any other suitable removal process(es). A process of forming ILD0 layer 29 may include CVD, PVD, sputtering, or any other suitable process(es). As illustrated by the cross-sectional view 4900 of FIG. 49, lower ILD layer 1741 may be planarized and its top surface recessed to expose dummy gate electrode 3702. Planarization and recessing may be by CMP or any other suitable process or combination of process(es).

As illustrated by the cross-sectional view 5000 of FIG. 50, a photoresist 5001 may be used to cover memory region 25 and high voltage region 46 while an etch is performed to remove dummy gate electrodes 3702, leaving voided areas 5002. As illustrated by cross-sectional view 5100 of FIG. 5100, metal gate electrodes 57 may then be formed by filling voided areas 5002 with. The filling may include one more layers of various metals formed by CVD, PVD, electroless plating, electroplating, or another suitable growth or deposition process(es). Metal that deposits or grows outside voided areas 5002 may then be removed by planarization. The planarization process may be CMP or the like.

As illustrated by the cross-sectional view 5200 of FIG. 52, a hard mask 5201 may be formed and patterned to cover core region 62 and control gate electrodes 7 while silicide pads 9, silicide pads 17, and silicide pads 34 are formed on select gate electrodes 23, erase gate electrodes 18, and high voltage gate electrodes 47 respectively. The silicides may be nickel silicide, another silicide(s), or the like and may be formed by any suitable saliciding process(es).

Additional processing may take place to form the structure of FIG. 1. This additional processing forms ILD1 layer 5, dielectric 3, vias 31, and metal lines 2. These may be formed by any suitable processes or combination of processes including, for example, damascene processes, dual damascene processes, and the like.

Figure 53A:
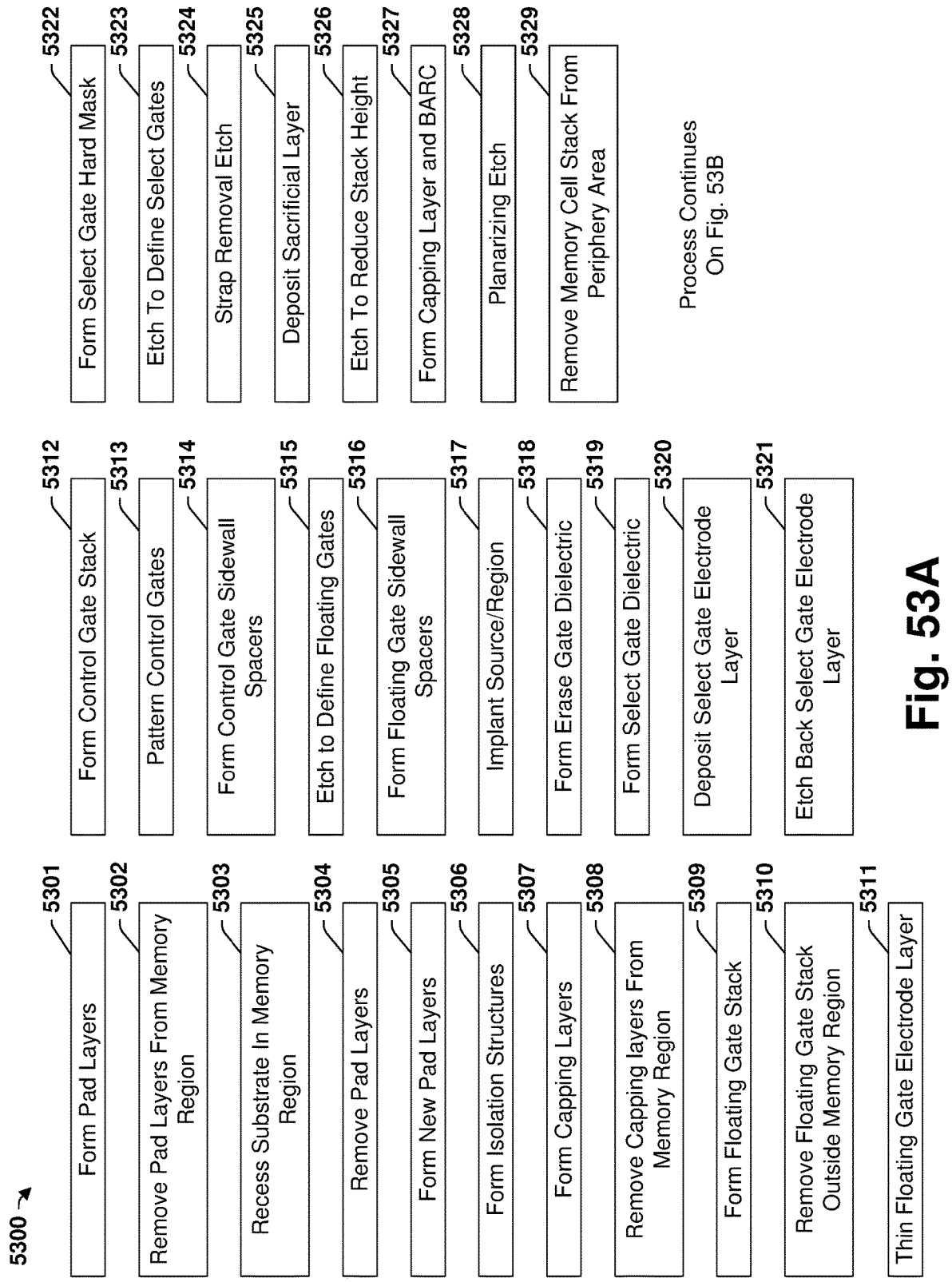
FIGS. 53A and 53B present a flow chart of a manufacturing process according to some aspects of the present disclosure.
Figure 53B:
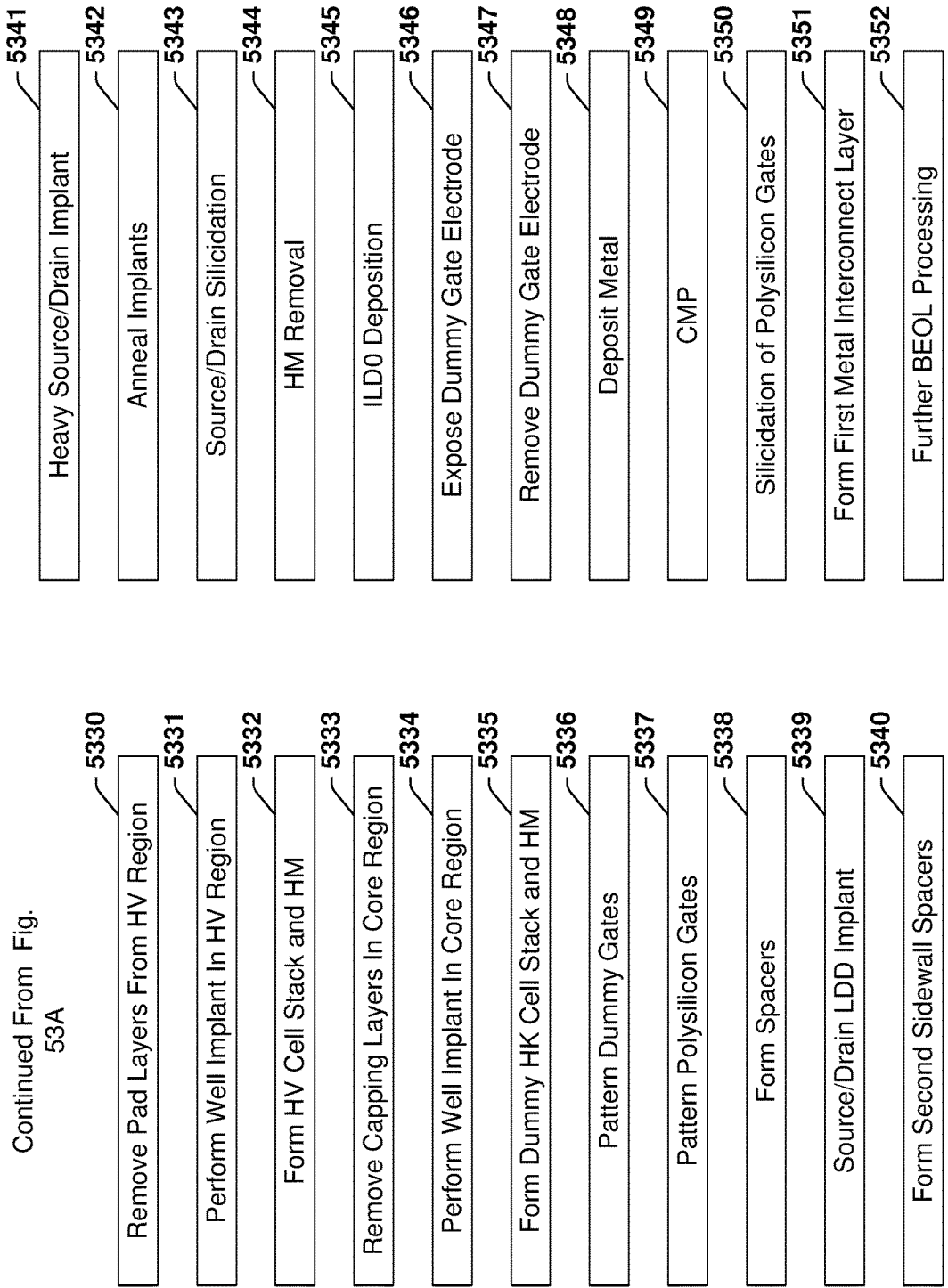

FIGS. 53A and 53B provides a flow chart of a process 5300 according to some aspects of the present disclosure that may be used to produce integrated circuit devices according to the present disclosure. While process 5300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Process 5300 begins with act 5301, forming pad layers, which may be pad oxide layer 201 and pad nitride layer 202, on a substrate 43 as shown in FIG. 2. Process 5300 continues with act 5302 removing pad oxide layer 201 and pad nitride layer 202 from memory area 90 as shown in FIG. 3. Act 5303 is recessing substrate 43 in memory area 90, as is also shown in FIG. 3.

Figure 5:
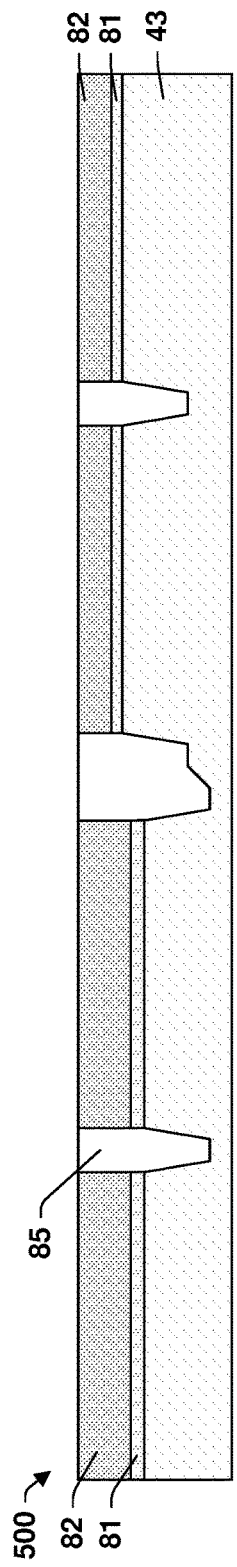

Act 5304 is removing pad oxide layer 201 and pad nitride layer 202. Act 5305 is forming new pad oxide layer 81 and new pad nitride layer 82, which are shown in FIG. 5. Act 5306 is forming isolation region 85 as shown in FIG. 8.

Act 5307 is forming nitride capping layer 86 and oxide capping layer 87 as shown in FIG. 6. Act 5308 is removing nitride capping layer 86 and oxide capping layer 87 from memory area 90 as shown in FIG. 7. Act 5309 is forming a floating gate stack including floating gate dielectric layer 902 and floating gate electrode layer 901. Act 5310 is planarizing to remove the floating gate from periphery area 91 as shown in FIG. 8. Act 5311 is thinning floating gate electrode layer 901 to a desired thickness as show in FIGS. 9 and 10.

Act 5312 is forming control gate stack 1105 including control gate dielectric layer 1101, control gate electrode layer 1102, and control gate hard mask layer 1103 as shown in FIG. 11. Act 5313 is patterning to define control gates including control gate dielectrics 13, control gate electrodes 7, and control gate hard masks 1201 as shown in FIG. 12. Act 5314 is forming control gate spacers 11 as shown in FIG. 13.

Act 5315 is etching to define floating gates including floating gate dielectrics 15 and floating gate electrodes 14. Act 5316 is forming floating gate spacers 1401 as shown in FIG. 14. Act 5317 is doping to provide memory source/drain regions 21 in memory region 25, as shown in FIG. 15.

Act 5318 is forming erase gate dielectric 19 as shown in FIG. 17. Act 5319 is forming select gate dielectric 22 as shown in FIG. 19. Act 5320 is depositing select gate electrode layer 2001 as shown in FIG. 20. Act 5321 is etching back select gate electrode layer 2001 to approximately the height of control gate electrodes 7, defining erase gate electrodes 18 as shown in FIG. 21.

Act 5322 is forming select gate hard mask layer 2201 as shown in FIG. 22. Act 5323 is a self-aligned etch to define select gate electrodes 23 from select gate electrode layer 2001 as shown in FIG. 23. Act 5324 is a strap removal etch. This results in a thinning of control gate hard mask 1103 in high voltage region 46 and core region 62 as shown in FIG. 24. Act 5325 is forming second ARC 2501 as shown in FIG. 25. Act 5326 is a planarizing etch that reduces the height of the memory stack as shown in FIG. 26. Act 5327 is depositing memory capping layer 2701 and dummy BARC 2702 as shown in FIG. 27. Act 5328 is a planarizing etch that removes dummy BARC 2702 as shown in FIG. 28. Act 5329 is removing the memory cell stack from high voltage region 46 and core region 62 as shown in FIG. 30.

Following the continuation of the flow chart on FIG. 53B, process 5300 continues with Act 5330, formation of hard mask 3101 as shown in FIG. 30. Act 5330 is forming a resist and removing hard mask 3101, pad nitride layer 82, and pad oxide layer 81 from high voltage region 46 as shown in FIG. 32. Act 5331 is forming a deep well implant in high voltage region 46 as shown in FIG. 33.

Act 5332 is forming high voltage gate stack 3403 as shown in FIG. 34. High voltage gate stack 3403 includes thick gate oxide layer 3404, polysilicon electrode layer 3401, and high voltage gate hard mask 3402. As shown in FIG. 34, of these layers, at least polysilicon electrode layer 3401 and high voltage gate hard mask 3402 form over hard mask 3101 in memory region 25 and core region 62.

Act 5333 is forming a photoresist 3501 and removing high voltage gate stack 3403, hard mask 3101, pad nitride layer 82, and pad oxide layer 81 from core region 62 as shown in FIG. 35. Act 5334 is forming a deep well implant in core region 62 as also shown in FIG. 35.

Act 5335 is forming dummy gate stack 3605 as shown in FIG. 36. Dummy gate stack 3605 may include an oxide layer 3601, a high-κ dielectric layer 3602, a dummy electrode layer 3603, and a dummy gate hard mask layer 3604. As shown in FIG. 36, of these layers, at least high-κ dielectric layer 3602 a dummy gate electrode layer 3603, and dummy gate hard mask layer 3604 form over high voltage gate hard mask 3402 in high voltage region 46 and memory region 25.

Act 5336 is patterning to remove dummy gate stack 3605 from high voltage region 46 and memory region 25 while defining dummy gates 3703 in core region 62 as shown in FIG. 37. High voltage gate hard mask 3402 may provide an etch stop for this process.

Act 5337 is patterning to remove high voltage gate stack 3403 from memory region 25 while defining high voltage gates 71 in high voltage region 46 as shown in FIG. 38. Hard mask 3101 may provide an etch stop for this process.

Act 5338 is forming spacer 39 adjacent dummy gates 3703 and high voltage gates 71 as shown in FIG. 39. Act 5339 is removing hard mask 3101 and memory capping layer 2701 from memory region 25 as shown in FIG. 40. Act 5340 is implanting memory source/drain regions 27, lightly doped high voltage source/drain regions 50, and lightly doped HKMG source/drain regions 63 as shown in FIGS. 40, 41, and 42 respectively. The number of masks and doping steps is dependent on the desired number of different source/drain doping types and concentrations.

Act 5341 is forming second sidewall spacers 38 and select gate sidewall spacers 33 as shown in FIG. 43. These spacers may be formed separately or simultaneously. Act 5342 is implanting heavily doped memory source/drain regions 26, heavily doped high voltage gate source/drain regions 49, and heavily doped HKMG source/drain regions 65 as shown in FIG. 44. Again, the number of masks and doping steps is dependent on the desired number of different source/drain doping types and concentrations. Act 5342 is annealing. This annealing repairs damage to substrate 43 caused by the implants and activates the implants. Act 5343 is saliciding to form silicide pads 30, 51, and 67 in memory region 25, high voltage region 46, and core region 62 respectively as shown in FIG. 44.

Act 5344 is removing select gate hard masks 2301, control gate hard masks 1201, and erase gate hard masks 2302 from memory region 25. This may be accomplished by depositing second ARC 4501 as show in FIG. 45 and non-selectively etching to recess the resulting surface as shown in FIG. 46. Second ARC 4501 may then be removed as show in FIG. 47.

Act 5345 is depositing a first inter-level dielectric layer, ILD0 layer 29 as shown in FIG. 48. This is followed by Act 5346, exposing dummy gate electrode 3702. This may be accomplished by planarization as shown in FIG. 49. Act 5347, removing dummy gate electrode 3702 as shown in FIG. 50.

Act 5348 is depositing and/or growing the metal for HKMG gates 70. This is followed by act 5349, CMP to remove excess metal, leaving only the metal that forms metal electrodes 57 as shown in FIG. 51. This CMP may be an operation that would cause excessive dishing in metal gates that have are of 1 $\mu m^2$ or greater. After CMP, upper surfaces 5101 of high voltage gates 71 are align with upper surfaces 5102 of HKMG gates 70.

Act 5350 is saliciding to form silicide pads 9, 17, and 34 on select gate electrodes 23, erase gate electrodes 18, and high voltage gate electrodes 47 respectively as shown in FIG. 52. A mask may be used to prevent silicide from forming on control gate electrodes 7.

Act 5351 is forming a first metal interconnect layer including vias 31, metal lines 2, and ILD1 layer 5 as shown in FIG. 1. Act 5352 is additional processing to complete formation of an IC device, including further back-end-of-line (BEOL) processing. It may be appreciated the process 5300 is a replacement gate or gate-last process.

Some aspects of the present teachings relate to an IC that includes a plurality of metal gates each having a metal electrode and a high-κ dielectric, a plurality of polysilicon gates each having a polysilicon electrode and conventional (non high-κ) dielectrics. The polysilicon gates are high voltage gates with thick dielectric layers. The polysilicon gates may be adapted for operation with a gate voltage of 10V or higher. In some of these teachings, the polysilicon gates have thicker dielectric than the metal gates. In some of these teachings, the polysilicon gates have areas greater than one $\mu m^2$. In some of these teachings, the polysilicon gates have areas greater than 3 $\mu m^2$. In some of these teachings the polysilicon electrodes have top surfaces that are aligned with top surfaces of the metal electrodes. In some of these teachings, the IC device includes embedded flash memory. In some of these teachings, the metal gates are the product of a replacement gate process. The metal gates may have a threshold voltage that would be altered by a 5 second heat treatment at 1000° C.

Some aspects of the present teachings relate to an IC that includes a semiconductor substrate having a memory area and a periphery area. A memory device is formed in the memory area and a high-κ metal gate is formed in the periphery area. A polysilicon gate is also formed in the periphery area. The polysilicon gate has an area that is larger than an area of the high-κ metal gate. The polysilicon gate may have an area greater than a design limit for the high-κ metal gates, which is less than one $\mu m^2$. In some of these teachings, the semiconductor substrate is implanted with dopants in source and drain regions operatively associated with the high-κ metal gate and the high-κ metal gate has a threshold voltage that would be altered by the minimum thermal processing that would anneal the semiconductor substrate implanted with the dopants. That minimal thermal processing may be greater than a 5 second heat treatment at 1000° C.

Some aspects of the present teachings relate to a method of forming an IC that includes forming a gate oxide layer in a first region of a substrate, forming a polysilicon layer over each of the first region of the substrate and a second region of the substrate and forming a protective layer over the polysilicon layer. While masking the first region, the protective layer and the polysilicon layer are removed from the second region. A high-κ dielectric layer and a dummy electrode layer are then formed over the first and second regions. The dummy electrode layer and the high-κ dielectric layer are then patterned to form dummy gates in the second region and to remove the dummy electrode layer and the high-κ dielectric layer from the first region. The protective layer and the polysilicon layer are then patterned to define polysilicon gates in the first region. Spacers are formed adjacent the dummy gates. After filling adjacent the spacers, the first and second regions are planarized. The dummy electrode layer is then removed from the dummy gates and replaced with metal. The first and second regions are then planarized to remove excess metal.

In some of these teachings, a hard mask is formed over the dummy electrode layer before patterning the dummy electrode layer and the high-κ dielectric layer to form dummy gates. In some of these teachings, a hard mask is formed and selectively removed from the first region prior to forming the gate oxide layer. In some of these teachings, source/drain area are implanted after forming the spacers and the implanted areas are annealed prior to replacing the dummy electrode layer with metal. performing a silicide process on the polysilicon gates after planarizing the first and second regions to remove excess metal. In some of the teachings, the method further includes forming flash memory devices in a third region of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit (IC) comprising:
 a semiconductor substrate comprising a first area and a second area;
 a polysilicon gate formed in the first area, wherein the polysilicon gate comprises a polysilicon electrode and a gate dielectric layer between the polysilicon electrode and the semiconductor substrate;

a high-κ metal gate formed in the second area, wherein the high-κ metal gate comprises a metal electrode and a high-κ dielectric layer between the metal electrode and the semiconductor substrate; and wherein the polysilicon electrode has a width that is greater than a width of the metal electrode;

the polysilicon gate is a high voltage gate having a threshold voltage higher than the high-κ metal gate;

the gate dielectric layer is thicker than the high-κ dielectric layer; and upper surfaces of the polysilicon electrode and the metal electrode are coplanar.

2. An IC according to claim 1, further comprising embedded flash memory.

3. An IC according to claim 1, further comprising split gate flash memory disposed on the semiconductor substrate, wherein the high-κ metal gate is a logic device.

4. An IC according to claim 1, wherein the polysilicon gate has an area greater than one $\mu m^2$.

5. An IC according to claim 1, wherein a threshold voltage of the high-κ metal gate would be altered by a 5 second heat treatment at 1000° C.

6. An IC according to claim 1, wherein the polysilicon gate has a gate dielectric layer adapted for operation with a gate voltage of 10V or higher.

7. An integrated circuit (IC) comprising:
a semiconductor substrate;
a plurality of metal gates disposed on the semiconductor substrate, wherein the metal gates comprise metal electrodes and high-κ dielectrics; and
a plurality of polysilicon gates disposed on the semiconductor substrate, wherein the polysilicon gates comprise polysilicon electrodes and gate dielectrics;
wherein the gate dielectrics have lower dielectric constants that the high-κ dielectrics;
the polysilicon electrodes have larger areas area than the metal electrodes;
the polysilicon electrodes have top surfaces that are coplanar with top surfaces of the metal electrodes; and
one or more of the plurality of polysilicon gates is a high voltage transistor having a threshold voltage of at least 10V.

8. An IC according to claim 7, further comprising split gate flash memory disposed on the semiconductor substrate.

9. An IC according to claim 7, wherein the plurality of polysilicon gates have areas greater than a design limit for the plurality of metal gates.

10. An IC according to claim 7, wherein:
the semiconductor substrate is implanted with dopants in source and drain regions of the plurality of metal gates;
the source and drain regions have physical structures resulting from annealing after the dopants were implanted; and
the plurality of metal gates have structures that would not be possible if the plurality of metal gates had been subjected to the annealing.

11. An IC according to claim 7, wherein:
the plurality of polysilicon gates comprise channel regions, and the gate dielectrics span gaps between the channel regions and the polysilicon electrodes; and
the gate dielectrics have dielectric constants lower than the high-κ dielectrics.

12. An IC according to claim 7, wherein the plurality of polysilicon gates have areas greater than one $\mu m^2$.

13. A method of forming an integrated circuit (IC) comprising:
providing a semiconductor substrate comprising a first region and a second region;
forming a gate oxide layer in the first region;
forming a polysilicon layer over the first region and the second region, whereby the polysilicon layer forms over the gate oxide layer;
forming a protective layer over the polysilicon layer;
masking the first region;
with the protective layer masked in the first region, selectively removing the protective layer and the polysilicon layer from the second region;
forming a high-κ dielectric layer over the first region and the second region, wherein the protective layer separates the high-κ dielectric layer from the polysilicon layer in the first region;
forming a dummy electrode layer over the high-κ dielectric layer;
patterning the dummy electrode layer and the high-κ dielectric layer to form dummy gates having dummy electrodes in the second region while removing the dummy electrode layer and the high-κ dielectric layer from the first region;
after forming the dummy gates, patterning the protective layer and the polysilicon layer to define polysilicon gates having polysilicon electrodes in the first region;
forming spacers adjacent the dummy gates;
filling an area adjacent the spacers;
planarizing the first and second regions, wherein planarizing exposes the dummy electrodes and the polysilicon electrodes;
removing the dummy electrodes to form voided areas;
depositing metal over the first and second regions, whereby the metal fills the voided areas to form metal electrodes; and
planarizing the first and second regions to remove excess metal.

14. A method according to claim 13, further comprising forming a hard mask over the dummy electrode layer before patterning the dummy electrode layer and the high-κ dielectric layer to form dummy gates.

15. A method according to claim 13, further comprising performing a silicide process on the polysilicon gates after planarizing the first and second regions to remove excess metal.

16. A method according to claim 13, wherein the polysilicon gates each have an area greater than one $\mu m^2$.

17. A method according to claim 13, wherein the polysilicon gates are operative as high voltage gates.

18. A method according to claim 13, wherein the gate oxide layer has a thickness adapted for a gate voltage of 10V or higher.

19. A method according to claim 13, further comprising forming flash memory devices in a third region of the semiconductor substrate.

20. A method according to claim 13, wherein the second region is masked while forming the gate oxide layer in the first region.

* * * * *